(12) United States Patent
Kim et al.

(10) Patent No.: US 11,115,021 B2
(45) Date of Patent: Sep. 7, 2021

(54) IMPEDANCE CALIBRATION CIRCUIT AND MEMORY DEVICE INCLUDING THE SAME

(71) Applicant: Samsung Electronics Co., Ltd., Suwon-si (KR)

(72) Inventors: Tongsung Kim, Seongnam-si (KR); Youngmin Jo, Hwaseong-si (KR); Jungjune Park, Seoul (KR); Jindo Byun, Suwon-si (KR); Dongho Shin, Hwaseong-si (KR); Jeongdon Ihm, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/021,728

(22) Filed: Sep. 15, 2020

(65) Prior Publication Data
US 2021/0242870 A1    Aug. 5, 2021

(30) Foreign Application Priority Data
Feb. 5, 2020   (KR) .......................... 10-2020-0013730

(51) Int. Cl.
*H03K 19/00*     (2006.01)
*H03K 19/0185*   (2006.01)
*G11C 7/10*      (2006.01)
*G11C 8/10*      (2006.01)
*H03K 19/08*     (2006.01)

(52) U.S. Cl.
CPC ....... *H03K 19/0005* (2013.01); *G11C 7/1057* (2013.01); *G11C 7/1084* (2013.01); *G11C 8/10* (2013.01); *H03K 19/018557* (2013.01); *H03K 19/018592* (2013.01); *H03K 19/0813* (2013.01); *G11C 2207/2254* (2013.01)

(58) Field of Classification Search
None
See application file for complete search history.

(56) References Cited

U.S. PATENT DOCUMENTS

| 6,556,039 | B2 | 4/2003 | Nagano et al. |
| 7,692,446 | B2 | 4/2010 | Lee et al. |
| 7,893,710 | B2 | 2/2011 | Lee |
| 7,969,182 | B2 | 6/2011 | Kim et al. |

(Continued)

FOREIGN PATENT DOCUMENTS

| KR | 100884591 B1 | 2/2009 |
| KR | 100933670 B1 | 12/2009 |
| KR | 1020140077588 A | 6/2014 |

*Primary Examiner* — Jany Richardson
(74) *Attorney, Agent, or Firm* — Muir Patent Law, PLLC

(57) ABSTRACT

An impedance calibration circuit includes a first code generation circuit connected to a first reference resistor, and configured to generate a first code for forming a resistance based on the first reference resistor, by using the first reference resistor; a second code generation circuit configured to form a resistance of a second reference resistor less than the resistance of the first reference resistor, based on the first code, and generate a second code by using the second reference resistor; and a target impedance code generation circuit configured to generate a target impedance code based on the first code, the second code, and a target impedance value, and form an impedance having the target impedance value in a termination driver connected to the impedance calibration circuit, based on the target impedance code.

20 Claims, 15 Drawing Sheets

(56) References Cited

U.S. PATENT DOCUMENTS

| | | | |
|---|---|---|---|
| 9,870,808 B2 | 1/2018 | Lee et al. | |
| 10,193,552 B1 | 1/2019 | Ji et al. | |
| 2006/0044007 A1* | 3/2006 | Lou | H04L 25/0278 326/30 |
| 2011/0241653 A1* | 10/2011 | Kim | H03K 19/0005 324/76.83 |
| 2014/0002130 A1* | 1/2014 | Jang | H03K 17/166 326/30 |

* cited by examiner

IMPEDANCE CALIBRATION CIRCUIT AND MEMORY DEVICE INCLUDING THE SAME

CROSS-REFERENCE TO RELATED APPLICATION

This application claims the benefit of Korean Patent Application No. 10-2020-0013730, filed on Feb. 5, 2020, in the Korean Intellectual Property Office, the disclosure of which is incorporated herein in its entirety by reference.

BACKGROUND

The inventive concept relates to an impedance calibration circuit, an impedance calibration method performed by the impedance calibration circuit, and a memory device, and more particularly, to an impedance calibration circuit that forms a target impedance by using a reference resistor, an impedance calibration method performed by the impedance calibration circuit, and a memory device including the impedance calibration circuit.

As an operational speed of a semiconductor memory device increases, a swing width of a signal transceived between the semiconductor memory device and a controller is reduced, and signal distortion due to impedance mismatch may become severe. To address this signal distortion, research is being carried out on an impedance calibration operation in which the output and/or termination impedance of a semiconductor memory device is constantly adjusted by using an external resistor such that the output and/or termination impedance of a semiconductor memory device may be independent of variations in process, voltage and temperature (PVT). This impedance calibration operation may be referred to as an input/output offset removal operation or a ZQ calibration operation.

As an operational speed of a semiconductor memory device gradually increases, it is necessary that an impedance calibration circuit that performs an impedance calibration operation is accurately provided with a termination impedance having a required target impedance value.

SUMMARY

The inventive concept provides an impedance calibration circuit, an impedance calibration method performed by the impedance calibration circuit, and a memory device including the impedance calibration circuit, by which a reliable termination impedance is provide for a wide-range target impedance value, and a driver area and a capacitance of an output terminal that is provided with the termination impedance are reduced.

According to an aspect of the inventive concept, there is provided an impedance calibration circuit including a first code generation circuit connected to a first reference resistor, and the first code generation circuit configured to generate a first code for forming a resistance based on the first reference resistor, by using the first reference resistor; a second code generation circuit configured to form a resistance of a second reference resistor less than the resistance of the first reference resistor, based on the first code and generate a second code by using the second reference resistor; and a target impedance code generation circuit configured to generate a target impedance code based on the first code, the second code, and a target impedance value, and form an impedance having the target impedance value in a termination driver connected to the impedance calibration circuit, based on the target impedance code.

According to another aspect of the inventive concept, there is provided an impedance calibration circuit including a first code generation circuit configured to generate a first code by using a first reference resistor, and form a resistance based on the first reference resistor and the first code; a second code generation circuit including a plurality of ZQ pull-up drivers configured to form a resistance of a second reference resistor, based on the first code, the second code generation circuit configured to generate a second code by using the second reference resistor; and a target impedance code generation circuit configured to select one from among the first code and the second code according to a result of comparing a target impedance value with a threshold impedance value and generate a target impedance code based on using the selected code, and form an impedance having the target impedance value for a termination driver connected to the impedance calibration circuit. Each ZQ pull-up driver includes either one or more PMOS transistors or one or more NMOS transistors.

According to another aspect of the inventive concept, there is provided a memory device including a memory cell region including a first metal pad, a peripheral circuit region including a second metal pad and vertically connected to the memory cell region by the first metal pad and the second metal pad, a first code generation circuit in the peripheral circuit region, connected to a first reference resistor, and configured to generate a first pull-up code for forming a resistance based on the first reference resistor in at least one ZQ pull-up driver by using the first reference resistor, and generate a first pull-down code for forming the resistance based on the first reference resistor in at least one ZQ pull-down driver, by using the first reference resistor; a second code generation circuit in the peripheral circuit region, configured to generate a second pull-up code and a second pull-down code for forming a resistance of a second reference resistor formed based on the first pull-up code or the first pull-down code, by using the second reference resistor; a target impedance code generation circuit in the peripheral circuit region, configured to generate a target impedance pull-up code, based on the first pull-up code, the second pull-up code, and a target impedance value, and generate a target impedance pull-down code, based on the first pull-down code, the second pull-down code, and the target impedance value; a plurality of DQ pins in the peripheral circuit region for transmitting or receiving data from or at the memory device; a plurality of target pull-up drivers in the peripheral circuit region, each respectively connected to a corresponding one of the plurality of DQ pins, and each configured to form a target pull-up impedance corresponding to the target impedance value, based on the target impedance pull-up code; and a plurality of target pull-down drivers in the peripheral circuit region, each respectively connected to a corresponding one of the plurality of DQ pins, and each configured to form a target pull-down impedance corresponding to the target impedance value, based on the target impedance pull-down code.

According to another aspect of the inventive concept, there is provided an impedance calibration method performed by an impedance calibration circuit in a memory device comprising a memory cell region including a first metal pad, a peripheral circuit region including a second metal pad and vertically connected to the memory cell region by the first metal pad and the second metal pad, the impedance calibration circuit connected to a first reference resistor, the impedance calibration method including generating a first code for forming a resistance based on the first reference resistor, by using the first reference resistor; generating a second code for forming a resistance of a second reference resistor formed based on the first code, by using the second reference resistor; and generating a target impedance code corresponding to a target impedance value, based on the first code, the second code, and the target impedance value.

According to another aspect of the inventive concept, there is provided a circuit in a memory device comprising a memory cell region including a first metal pad, a peripheral circuit region including a second metal pad and vertically connected to the memory cell region by the first metal pad and the second metal pad, the circuit including a pull-down driver in the peripheral circuit region that forms a pull-down impedance between a ground node and a first node, based on a pull-down code; a multi pull-up driver in the peripheral circuit region, including a plurality of pull-up drivers connected in parallel between a driving voltage node and the first node, wherein the plurality of pull-up drivers have the same configurations; a comparator in the peripheral circuit region, configured to compare a voltage of the first node with a reference voltage and outputs a result of the comparison; and a code generation circuit in the peripheral circuit region, connected to the comparator and configured to generate the pull-down code and provide the pull-down code to the pull-down driver.

According to another aspect of the inventive concept, there is provided a circuit including a pull-up driver that forms a pull-up impedance between a driving voltage node and a first node, based on a pull-up code; a multi pull-down driver including a plurality of pull-down drivers connected in parallel between a ground node and the first node, wherein the plurality of pull-down drivers have identical configurations; a comparator configured to compare a voltage of the first node with a reference voltage and outputs a result of the comparison; and a code generation circuit connected to the comparator and configured to generate the pull-up code and provide the pull-up code to the pull-up driver.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, the inventive concept will be described more fully with reference to the accompanying drawings, in which exemplary embodiments of the inventive concept are shown.

Figure 1:
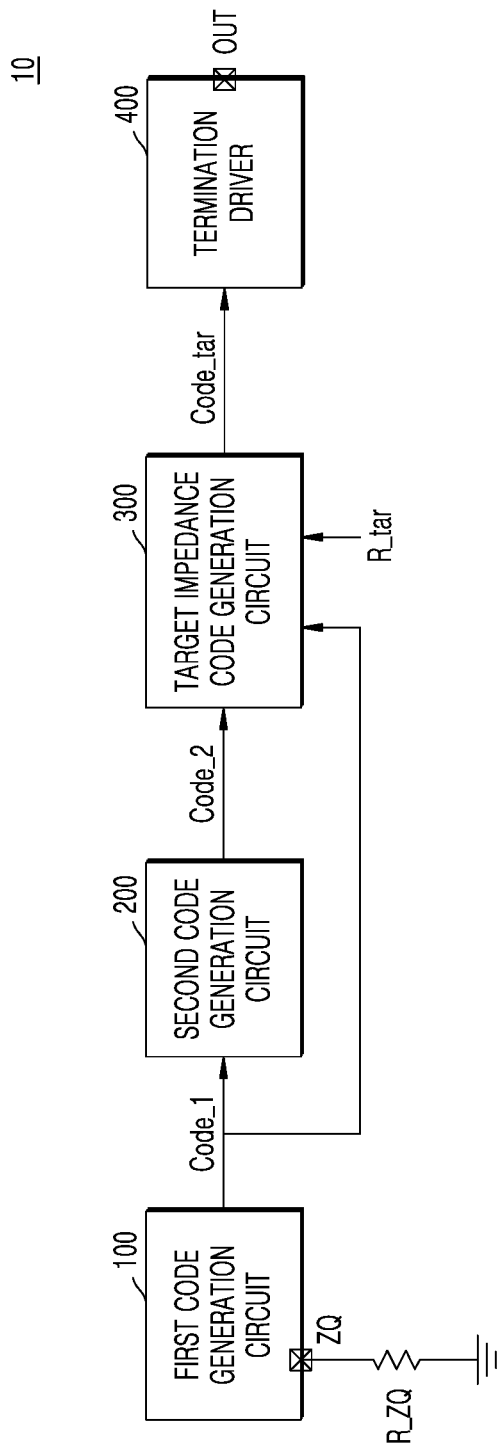
FIG. 1 is a block diagram of an impedance calibration circuit according to an embodiment of the inventive concept.
Figure 15:
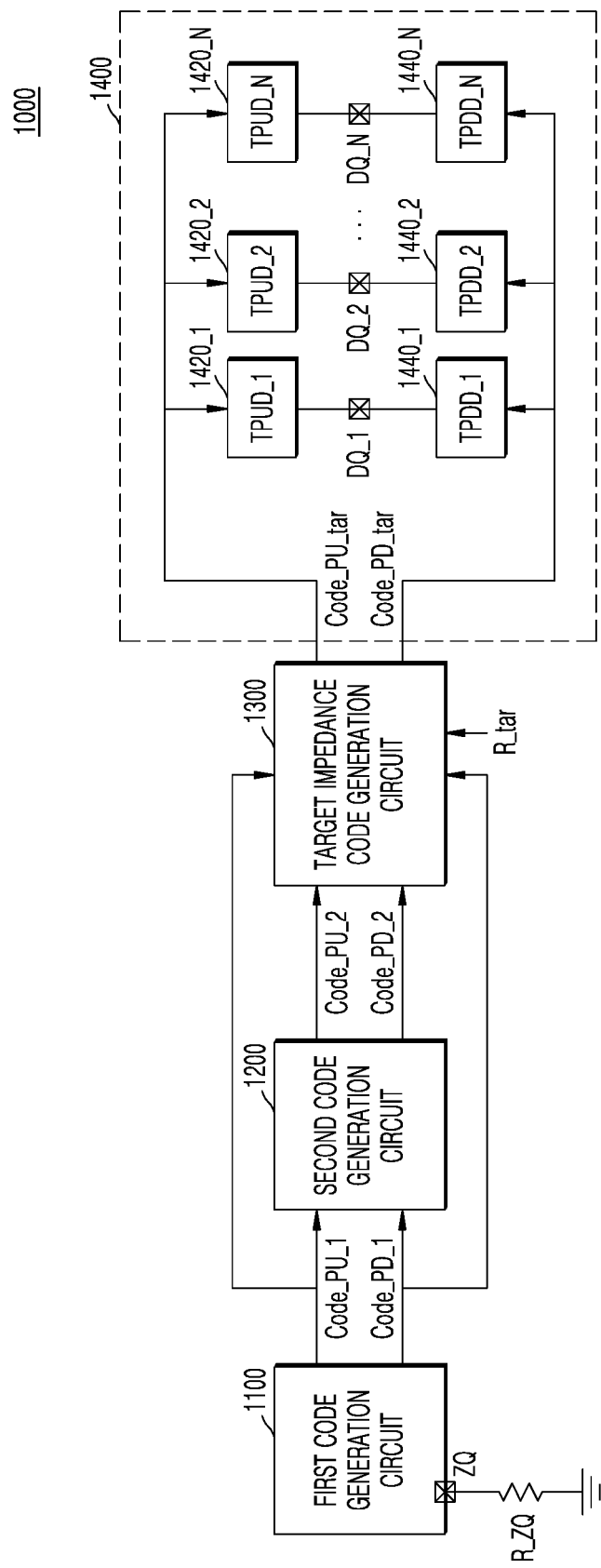
FIG. 15 is a block diagram of a memory device according to an embodiment of the inventive concept.

FIG. 1 is a block diagram of an impedance calibration circuit 10 according to an embodiment of the inventive concept. The impedance calibration circuit 10 may include a first code generation circuit 100, a second code generation circuit 200, a target impedance code generation circuit 300, and a termination driver 400. The impedance calibration circuit 10 may provide a termination impedance having a target impedance value R_tar to an output terminal OUT by using an external resistor R_ZQ. The impedance calibration circuit 10 may be implemented within a device that requires a termination impedance having a specific impedance value in an output terminal OUT. For example, the impedance calibration circuit 10 may be implemented in a memory device or the like as shown in FIG. 15. As used herein, the memory device (and others described herein) may refer to a device such as a semiconductor chip (e.g., memory chip and/or logic chip formed from a wafer) forming an integrated circuit, a stack of semiconductor chips, a semiconductor package including one or more semiconductor chips stacked on a package substrate, or a package-on-package device including a plurality of packages.

The first code generation circuit 100 may generate a first code Code_1 by using a first reference resistor. As used herein, the term "reference resistor" may mean a resistance circuit that can include a single resistor, or can include a plurality of resistors connected, for example, as part of a circuit that provides for variable resistance. The first reference resistor may be an external resistor, for example, the external resistor R_ZQ connected via a ZQ pin ZQ. The first code Code_1 may indicate a code for forming the same resistance as the resistance of the external resistor R_ZQ. For reference, in the present specification, a resistance may have substantially the same meaning as an impedance value. For example, when a specific circuit element having a reactance component of '0' or greater is ideal, a resistance is substantially the same as an impedance value. The impedance calibration circuit 100 may provide the first code Code_1 to the second code generation circuit 200 and the target impedance code generation circuit 300. According to an embodiment, the first code generation circuit 100 may include at least one ZQ pull-up driver and at least one ZQ pull-down driver, and the first code Code_1 may include a first pull-up code and a first pull-down code. The first pull-up code may indicate a code for forming the resistance of the external resistor R_ZQ in the at least one ZQ pull-up driver, and the first pull-down code may indicate a code for forming the resistance of the external resistor R_ZQ in the at least one ZQ pull-down driver. According to an embodiment, the first code generation circuit 100 may be implemented using two ZQ pull-up drivers and one ZQ pull-down driver. However, embodiments of the inventive concept are not limited thereto. For example, the first code generation circuit 100 may be implemented using one ZQ pull-up driver and two ZQ pull-down drivers. The impedance calibration circuit 100 will be described later in more detail with reference to FIGS. 2A and 2B.

The second code generation circuit 200 may generate a second code Code_2 by using a second reference resistor. A resistance of the second reference resistor may be less than the resistance of the first reference resistor (or the external resistor R_ZQ). According to an embodiment, the second reference resistor may be formed based on the first code Code_1 that is provided by the first code generation circuit 100. The second code generation circuit 200 may provide the second code Code_2 to the target impedance code generation circuit 300. According to an embodiment, the second code generation circuit 200 may include a second reference resistance forming circuit configured to form the resistance of the second reference resistor, based on the first code Code_1. For example, the second reference resistance forming circuit may include a plurality of ZQ pull-up drivers each forming the resistance of the first reference resistor, based on the first pull-up code included in the first code Code_1, the plurality of ZQ pull-up drivers being connected to each other in parallel. However, embodiments of the inventive concept are not limited thereto. For example, the second reference resistance forming circuit may include a plurality of ZQ pull-down drivers each forming the resistance of the first reference resistor, based on the first pull-down code included in the first code Code_1, the plurality of ZQ pull-down drivers and being connected to each other in parallel. According to an embodiment, the second code generation circuit 200 may form a second reference resistance through a plurality of ZQ drivers (e.g., m ZQ drivers; m is a natural number equal to or greater than 2) that form a first reference resistance, based on the first code Code_1, and are connected to each other in parallel. According to an embodiment, the resistance of the second reference resistor may correspond to a value obtained by dividing the resistances of the first reference resistor by the number (m) of ZQ drivers. According to an embodiment, the number of bits of the second code Code_2 may be greater than the number of bits of the first code Code_1. The second code generation circuit 200 will be described later in more detail with reference to FIGS. 5 and 7 through 9.

The target impedance code generation circuit 300 may generate a target impedance code Code_tar, based on the first code Code_1, the second code Code_2, and the target impedance value R_tar, and may output the target impedance code Code_tar. The target impedance code Code_tar may indicate a code for forming the termination impedance having the target impedance value R_tar in the termination driver 400. For example, the target impedance code Code_tar may be a code corresponding to the target impedance value R_tar. The target impedance value R_tar is a value required by the impedance calibration circuit 10, and thus may be input from the outside of the impedance calibration circuit 10. According to an embodiment, the target impedance value R_tar may be a value that is set by a set feature command.

According to an embodiment, the target impedance code generation circuit 300 may obtain a plurality of impedance value sections, and may generate the target impedance code Code_tar by performing an operation by using the first code Code_1 and the second code Code_2, based on an impedance value section to which the target impedance value R_tar belongs. As a non-restrictive example, the plurality of impedance value sections may be sections obtained based on a threshold impedance value. For example, the target impedance code generation circuit 300 may compare the target impedance value R_tar with the threshold impedance value, may select one from among the first code Code_1 and the second code Code_2 according to a result of the comparison, and may generate the target impedance code Code_tar by performing an operation on the selected code. The operation may include a shift operation. For example, when the target impedance value R_tar is greater than the threshold impedance value, the target impedance code generation circuit 300 may select the first code Code_1 and may generate the target impedance code Code_tar by using the first code Code_1. For example, when the target impedance value R_tar is less than the threshold impedance value, the target impedance code generation circuit 300 may select the second code Code_2 and may generate the target impedance code Code_tar by using the second code Code_2. The target impedance code generation circuit 300 may provide the target impedance code Code_tar to the termination driver 400. According to an embodiment, the target impedance code Code_tar may include a target impedance pull-up code and a target impedance pull-down code. The target impedance code generation circuit 300 will be described later in more detail with reference to FIGS. 10 through 12.

The termination driver 400 may provide the termination impedance having the target impedance value R_tar to the output terminal OUT, based on the target impedance code Code_tar. For example, the termination driver 400 may include a termination pull-up driver and a termination pull-down driver. As the termination pull-up driver forms a termination pull-up impedance, based on the target impedance pull-up code, and the termination pull-down driver forms a termination pull-down impedance, based on the target impedance pull-down code, the termination driver 400 may provide the termination impedance having the target impedance value R_tar to the output terminal OUT.

The impedance calibration circuit 10 according to an embodiment of the inventive concept may generate the target impedance code Code_tar for forming the target impedance value R_tar, based on the first code Code_1 formed using the first reference resistor and the second code Code_2 formed using the second reference resistor. An impedance calibration circuit according to a first comparative example that generates a target impedance code, based on a code formed using one reference resistor, needs to perform an operation of shifting a code by a large number of bits in order to cover a wide-range target impedance value. This causes non-linearity between the code and the impedance value of the termination impedance. Compared with the impedance calibration circuit according to the first comparative example, the impedance calibration circuit 10 according to an embodiment of the inventive concept may maintain linearity between a code and an impedance value with respect to the target impedance value R_tar in a wide range, by generating the target impedance code Code_tar, based on the first code Code_1 formed using the first reference resistor and the second code Code_2 formed using the second reference resistor, wherein the second reference resistor is smaller than the first reference resistor. For example, the impedance calibration circuit 10 according to an embodiment of the inventive concept may provide a reliable termination impedance for the wide range of the target impedance value R_tar.

In addition, in the impedance calibration circuit 10 according to an embodiment of the inventive concept, instead that a plurality of ZQ drivers that occupy a relatively wide area and have a wide capacitance are connected to the output terminal OUT, the plurality of ZQ drivers are included in the second code generation circuit 200, and thus, compared with a comparative example in which a plurality of drivers are connected to an output terminal, the driver area and capacitance of drivers connected to the output terminal OUT may be reduced.

Figure 2A:
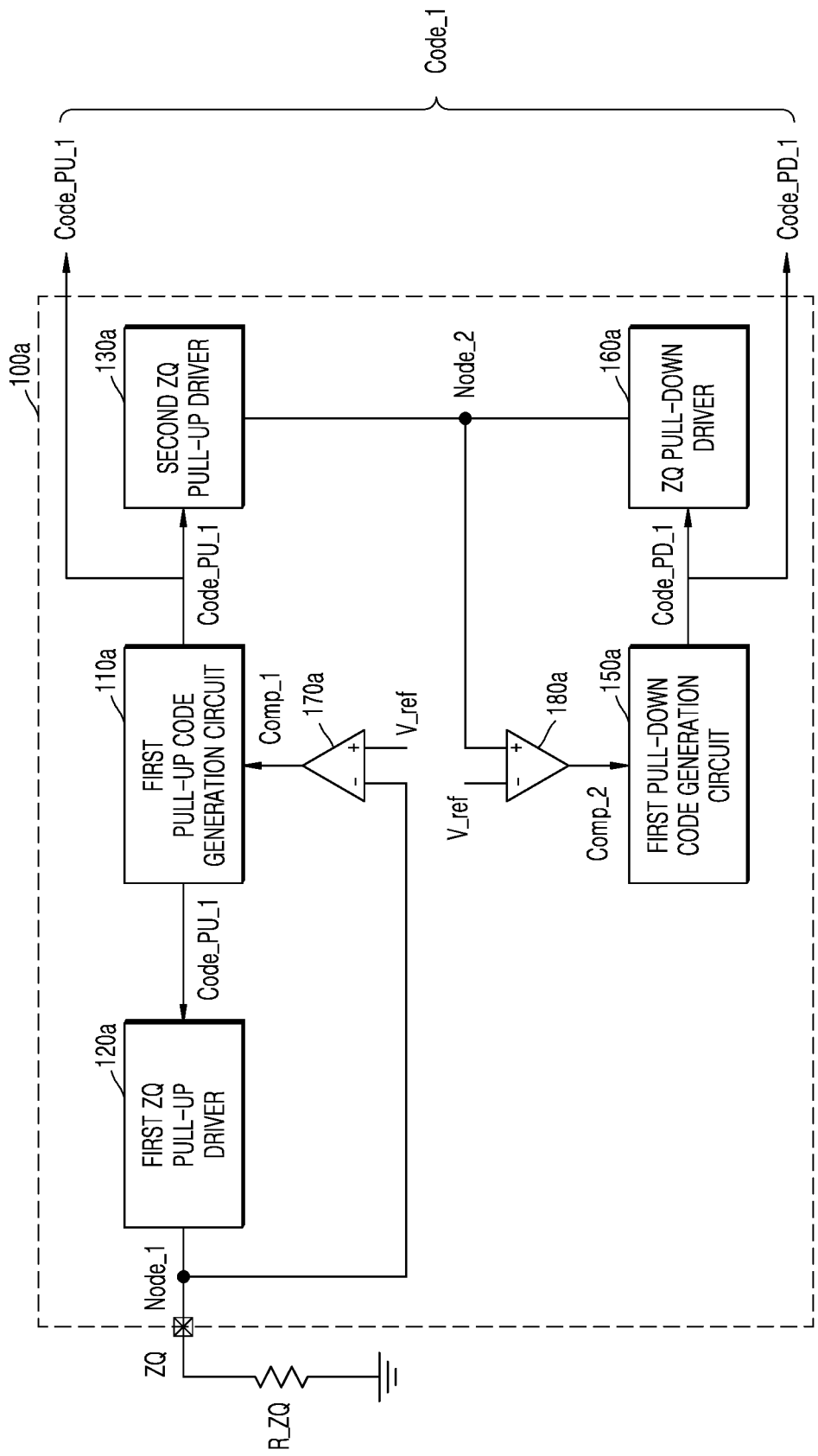
FIGS. 2A and 2B are block diagrams of first code generation circuits according to an embodiment of the inventive concept.
Figure 2B:
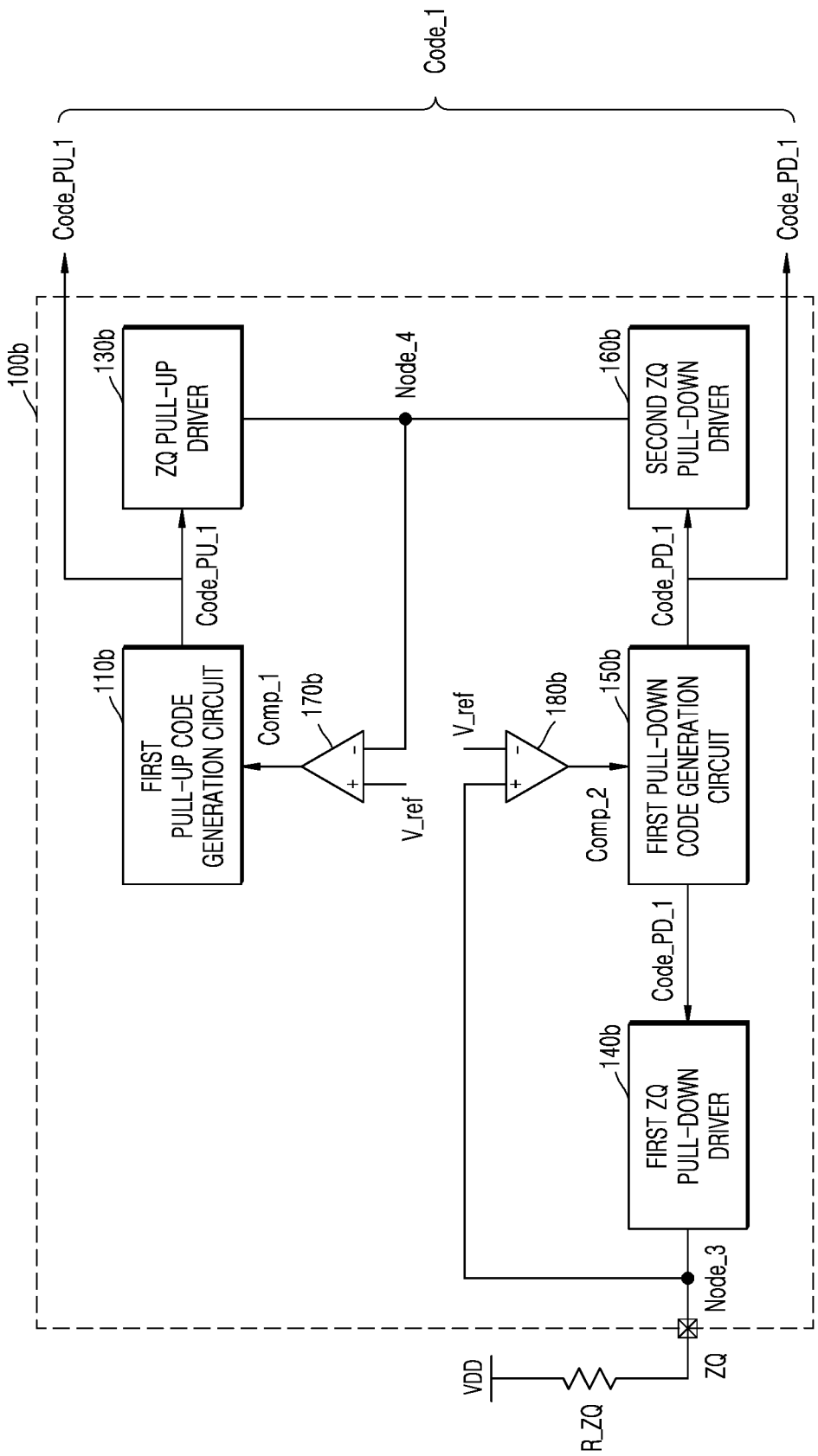

FIGS. 2A and 2B are block diagrams of first code generation circuits 100a and 100b according to an embodiment of the inventive concept. The first code generation circuits 100a and 100b may correspond to the first code generation circuit 100 of FIG. 1. FIGS. 2A and 2B will now be described with reference to FIG. 1.

Referring to FIG. 2A, the first code generation circuit 100a may include a first pull-up code generation circuit 110a, a first ZQ pull-up driver 120a, a second ZQ pull-up driver 130a, a first pull-down code generation circuit 150a, a ZQ pull-down driver 160a, a first comparator 170a, and a second comparator 180a. Although FIG. 2A illustrates inclusion of two comparators, embodiments of the inventive concept are not limited thereto. For example, the first code generation circuit 100a may include only one comparator. For example, the first comparator 170a and the second comparator 180a of FIG. 2A may be shared within the first code generation circuit 100a.

The external resistor R_ZQ may be connected between the ZQ pin (or ZQ pad) ZQ and a ground node.

The first comparator 170a may provide a first comparison result Comp_1 to the first pull-up code generation circuit 110a by comparing a voltage of a first node Node_1 indicating an electrical node between the external resistor R_ZQ and the first ZQ pull-up driver 120a with a reference voltage V_ref. The reference voltage V_ref may be provided by a reference voltage generation circuit within the impedance calibration circuit 10. According to an embodiment, the reference voltage V_ref may be a half of a driving voltage. The driving voltage may be applied to various pull-up drivers disclosed herein.

The first pull-up code generation circuit 110a may generate a first pull-up code Code_PU_1, based on the first comparison result Comp_1. The first pull-up code generation circuit 110a may provide the first pull-up code Code_PU_1 to the first ZQ pull-up driver 120a and the second ZQ pull-up driver 130a, and may output the first pull-up code Code_PU_1 to the outside of the first code generation circuit 100a.

The first ZQ pull-up driver 120a may form an impedance, based on the first pull-up code Code_PU_1, and the second ZQ pull-up driver 130a may form an impedance, based on the first pull-up code Code_PU_1. Each of the first ZQ pull-up driver 120a and the second ZQ pull-up driver 130a may be implemented as a pull-up driver of FIG. 3. Through an operation of a closed loop including the first pull-up code generation circuit 110a, the first ZQ pull-up driver 120a, and the first comparator 170a, the first ZQ pull-up driver 120a may consequently form the same impedance as the resistance of the external resistor R_ZQ, and the second ZQ pull-up driver 130a may also consequently form the same impedance as the resistance of the external resistor R_ZQ.

The second comparator 180a may provide a second comparison result Comp_2 to the first pull-down code generation circuit 150a by comparing a voltage of a second node Node_2 indicating an electrical node between the ZQ pull-down driver 160a and the first ZQ pull-up driver 130a with a reference voltage V_ref. The reference voltage V_ref may be provided by a reference voltage generation circuit within the impedance calibration circuit 10. According to an embodiment, the reference voltage V_ref may be a half of the driving voltage. In an embodiment, the reference voltage V_ref applied to the second comparator 180a may be the same as the reference voltage V_ref applied to the first comparator 170a.

The first pull-down code generation circuit 150a may generate a first pull-down code Code_PD_1, based on the second comparison result Comp_2. The first pull-down code generation circuit 150a may provide the first pull-down code Code_PD_1 to the ZQ pull-down driver 160a, and may output the first pull-down code Code_PD_1 to the outside of the first code generation circuit 100a.

The ZQ pull-down driver 160a may form an impedance, based on the first pull-down code Code_PD_1. The ZQ pull-down driver 160a may be implemented as a pull-down driver of FIG. 4. Through an operation of a closed loop including the first pull-down code generation circuit 150a, the first ZQ pull-down driver 160a, and the second comparator 180a, the ZQ pull-down driver 160a may consequently form the same impedance as the impedance value of the second ZQ pull-up driver 130a. For example, the ZQ pull-down driver 160a may form the same impedance as the impedance value of the external resistor R_ZQ.

The first code generation circuit 100a may output the first pull-up code Code_PU_1 and the first pull-down code Code_PD_1 as the first code Code_1.

Referring to FIG. 2B, the first code generation circuit 100b may include a first pull-up code generation circuit 110b, a ZQ pull-up driver 130b, a first pull-down code generation circuit 150b, a first ZQ pull-down driver 140b, a second ZQ pull-down driver 160b, a first comparator 170b, and a second comparator 180b. Although FIG. 2B illustrates inclusion of two comparators, embodiments of the inventive concept are not limited thereto. For example, the first code generation circuit 100b may include only one comparator. For example, the first comparator 170b and the second comparator 180b of FIG. 2B may be shared within the first code generation circuit 100b.

The external resistor R_ZQ may be connected between the ZQ pin ZQ and a driving voltage node VDD. In some examples, various power supply voltages may be applied to the driving voltage node VDD such as an external power supply voltage, an output driver voltage, and a power supply voltage.

The second comparator 180b may provide a second comparison result Comp_2 to the first pull-down code generation circuit 150b by comparing a voltage of a third node Node_3 indicating an electrical node between the external resistor R_ZQ and the first ZQ pull-down driver 140b with a reference voltage V_ref. The reference voltage V_ref may be provided by a reference voltage generation circuit within the impedance calibration circuit 10. According to an embodiment, the reference voltage V_ref may be a half of the driving voltage.

The first pull-down code generation circuit 150b may generate a first pull-down code Code_PD_1, based on the second comparison result Comp_2. The first pull-down code generation circuit 150b may provide the first pull-down code Code_PD_1 to the first ZQ pull-down driver 140b and the second ZQ pull-down driver 160b, and may output the first pull-down code Code_PD_1 to the outside of the first code generation circuit 100b.

The first ZQ pull-down driver 140b may form an impedance, based on the first pull-down code Code_PD_1, and the second ZQ pull-down driver 160b may form an impedance, based on the first pull-down code Code_PD_1. Each of the first ZQ pull-down driver 140b and the second ZQ pull-down driver 160b may be implemented as the pull-down driver of FIG. 4. Through an operation of a closed loop including the first pull-down code generation circuit 150b, the first ZQ pull-down driver 140b, and the second comparator 180b, the first ZQ pull-down driver 140b may consequently form the same impedance as the resistance of the external resistor R_ZQ, and the second ZQ pull-down driver 160b may also consequently form the same impedance as the resistance of the external resistor R_ZQ.

The first comparator 170b may provide a first comparison result Comp_1 to the first pull-up code generation circuit 110b by comparing a voltage of a fourth node Node_4 indicating an electrical node between the ZQ pull-up driver 130b and the second ZQ pull-down driver 160b with a reference voltage V_ref. The reference voltage V_ref may be provided by a reference voltage generation circuit within the impedance calibration circuit 10. According to an embodiment, the reference voltage V_ref may be a half of the driving voltage. In an embodiment, the reference voltage V_ref applied to the first comparator 170b may be the same as the reference voltage V_ref applied to the second comparator 180b.

The first pull-up code generation circuit 110b may generate a first pull-up code Code_PU_1, based on the first comparison result Comp_1. The first pull-up code generation circuit 110b may provide the first pull-up code Code_PU_1 to the ZQ pull-up driver 130b, and may output the first pull-up code Code_PU_1 to the outside of the first code generation circuit 100b.

The ZQ pull-up driver 130b may form an impedance, based on the first pull-up code Code_PU_1. The ZQ pull-up driver 130b may be implemented as the pull-up driver of FIG. 3. Through an operation of a closed loop including the first pull-up code generation circuit 110b, the first ZQ pull-up driver 130b, and the first comparator 170b, the ZQ pull-up driver 130b may consequently form the same impedance as the impedance value of the second ZQ pull-down driver 160b. For example, the ZQ pull-up driver 130b may form the same impedance as the impedance value of the external resistor R_ZQ.

The first code generation circuit 100b may output the first pull-up code Code_PU_1 and the first pull-down code Code_PD_1 as the first code Code_1.

Figure 3:
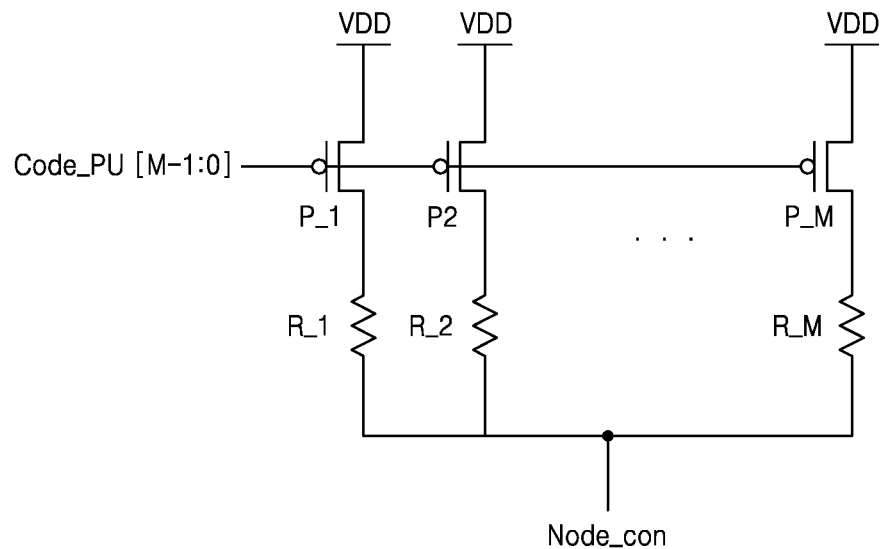
FIG. 3 is a circuit diagram of a pull-up driver according to an embodiment of the inventive concept.

FIG. 3 is a circuit diagram of a pull-up driver according to an embodiment of the inventive concept. Each of the first ZQ pull-up driver 120a and the second ZQ pull-up driver 130a of FIG. 2A and the ZQ pull-up driver 130b of FIG. 2B may be implemented as the pull-up driver of FIG. 3.

The pull-up driver may include a plurality of P-type metal oxide semiconductor (PMOS) transistor-resistor sets connected between a driving voltage node VDD and a connection node Node_con. For example, a first PMOS transistor P_1 and a first resistor R_1 may be serially connected between the driving voltage node VDD and the connection node Node_con, a second PMOS transistor P_2 and a second resistor R_2 may be serially connected between the driving voltage node VDD and the connection node Node_con, and an M-th PMOS transistor P_M and an M-th resistor R_M may be serially connected between the driving voltage node VDD and the connection node Node_con (where M is a natural number equal to or greater than 2). According to an embodiment, the first through M-th resistors R_1 through R_M may have the same resistances. The first through M-th PMOS transistor P_1 through P_M may be driven by an M-bit pull-up code Code_PU[M−1:0]. In example embodiments, the first resistor R_1 through the M-th resistor R_M may be omitted. In this case, each of the first PMOS transistor P_1 through the M-th PMOS transistor P_M may have a resistance value corresponding to a turn-on resistance of each of the first PMOS transistor P_1 through the M-th PMOS transistor P_M.

According to an embodiment, the pull-up driver may include a plurality of N-type metal oxide semiconductor (NMOS) transistor-resistor sets connected between the driving voltage node VDD and the connection node Node_con.

According to an embodiment, the pull-up driver may be implemented as a binary type driver. The binary type driver may indicate a driver configured such that a plurality of PMOS transistors are sequentially doubled in terms of width. For example, the width of the first PMOS transistor P_1 may be twice the width of the second PMOS transistor P_2, and the width of the second PMOS transistor P_2 may be twice the width of a third PMOS transistor P_3. As the pull-up driver is implemented as a binary type driver, the pull-up driver may provide various impedance values.

According to an embodiment, a gate of the first PMOS transistor P_1 may be driven by the most significant bit value of the M-bit pull-up code Code_PU[M−1:0], a gate of the second PMOS transistor P_2 may be driven by a second most significant bit value of the M-bit pull-up code Code_PU[M−1:0], and a gate of the M-th PMOS transistor P_M may be driven by the least significant bit value of the M-bit pull-up code Code_PU[M−1:0]. However, embodiments of the inventive concept are not limited thereto. For example, the gate of the first PMOS transistor P_1 may be driven by the least significant bit value of the M-bit pull-up code Code_PU[M−1:0], and the gate of the M-th PMOS transistor P_M may be driven by the most significant bit value of the M-bit pull-up code Code_PU[M−1:0].

The connection node Node_con may indicate an electrical node to which a circuit element outside the pull-up driver is connected. For example, when the first ZQ pull-up driver 120a of FIG. 2A is implemented as shown in FIG. 3, the connection node Node_con may be connected to the first node Node_1. For example, when the second ZQ pull-up driver 130a of FIG. 2A is implemented as shown in FIG. 3, the connection node Node_con may be connected to the second node Node_2. For example, when the ZQ pull-up driver 130b of FIG. 2B is implemented as shown in FIG. 3, the connection node Node_con may be connected to the fourth node Node_4.

Figure 4:
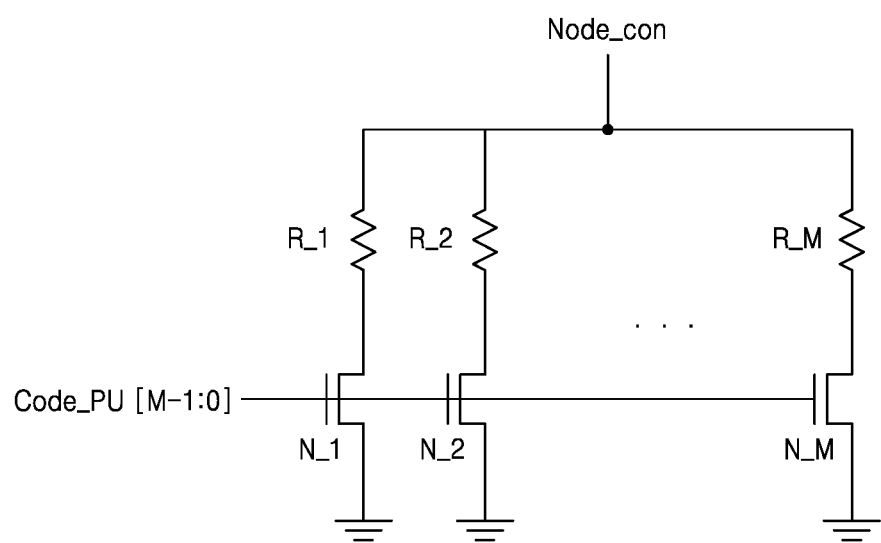
FIG. 4 is a circuit diagram of a pull-down driver according to an embodiment of the inventive concept.

FIG. 4 is a circuit diagram of a pull-down driver according to an embodiment of the inventive concept. Each of the ZQ pull-down driver 160a of FIG. 2A and the first ZQ pull-down driver 140b and the second ZQ pull-down driver 160b of FIG. 2B may be implemented as the pull-down driver of FIG. 4.

The pull-down driver may include a plurality of NMOS transistor-resistor sets connected between ground nodes and a connection node Node_con. For example, a first NMOS transistor N_1 and a first resistor R_1 may be serially connected between a ground node and the connection node Node_con, a second NMOS transistor N_2 and a second resistor R_2 may be serially connected between the ground node and the connection node Node_con, and an M-th NMOS transistor N_M and an M-th resistor R_M may be serially connected between the ground node and the connection node Node_con (where M is a natural number equal to or greater than 2). According to an embodiment, the first through M-th resistors R_1 through R_M may have the same resistances. The first through M-th NMOS transistor N_1 through N_M may be driven by an M-bit pull-down code Code_PD[M−1:0]. In example embodiments, the first resistor R_1 through the M-th resistor R_M may be omitted. In this case, each of the first NMOS transistor N_1 through the M-th NMOS transistor N_M may have a resistance value corresponding to a turn-on resistance of each of the first NMOS transistor N_1 through the M-th NMOS transistor N_M.

According to an embodiment, the pull-down driver may be implemented as a binary type driver. The binary type driver may indicate a driver configured such that a plurality of NMOS transistors are sequentially doubled in terms of width. For example, the width of the first NMOS transistor N_1 may be twice the width of the second NMOS transistor N_2, and the width of the second NMOS transistor N_2 may be twice the width of a third NMOS transistor. As the pull-down driver is implemented as a binary type driver, the pull-down driver may provide various impedance values.

According to an embodiment, a gate of the first NMOS transistor N_1 may be driven by the most significant bit value of the M-bit pull-down code Code_PD[M−1:0], a gate of the second NMOS transistor N_2 may be driven by a second most significant bit value of the M-bit pull-down code Code_PD[M−1:0], and a gate of the M-th NMOS transistor N_M may be driven by the least significant bit value of the M-bit pull-down code Code_PD[M−1:0]. However, embodiments of the inventive concept are not limited thereto. For example, the gate of the first NMOS transistor N_1 may be driven by the least significant bit value of the M-bit pull-down code Code_PD[M−1:0], and the gate of the M-th NMOS transistor N_M may be driven by the most significant bit value of the M-bit pull-down code Code_PD [M−1:0].

The connection node Node_con may indicate an electrical node to which a circuit element outside the pull-down driver is connected. For example, when the ZQ pull-down driver 160a of FIG. 2A is implemented as shown in FIG. 4, the connection node Node_con may be connected to the second node Node_2. For example, when the first ZQ pull-down driver 140b of FIG. 2B is implemented as shown in FIG. 4, the connection node Node_con may be connected to the third node Node_3. For example, when the second ZQ pull-down driver 160b of FIG. 2B is implemented as shown in FIG. 4, the connection node Node_con may be connected to the fourth node Node_4.

Figure 5:
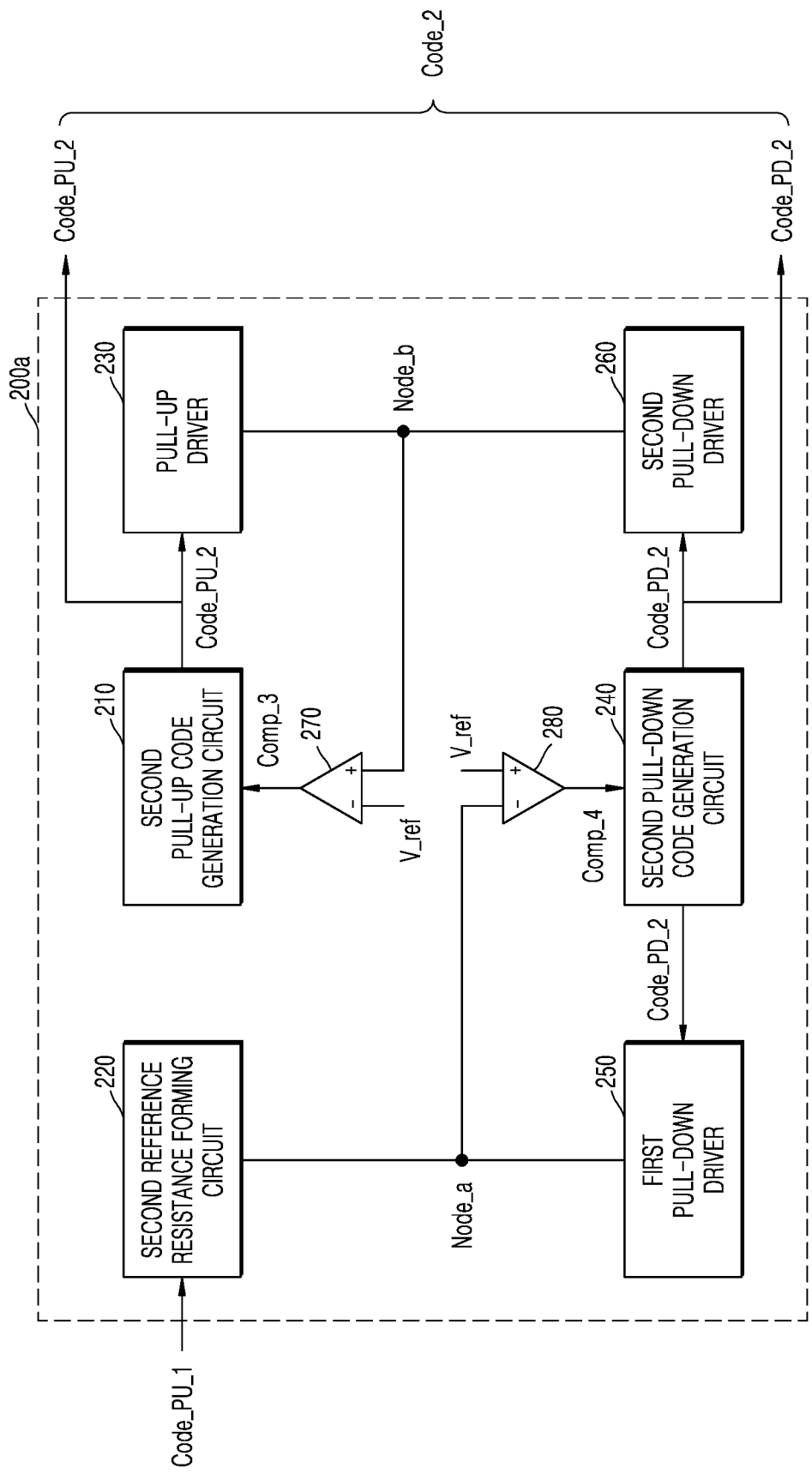
FIG. 5 is a block diagram of a second code generation circuit according to an embodiment of the inventive concept.

FIG. 5 is a block diagram of a second code generation circuit 200a according to an embodiment of the inventive concept. FIG. 5 will now be described with reference to FIG. 1. The second code generation circuit 200a may correspond to the second code generation circuit 200 of FIG. 1.

The second code generation circuit 200a may include a second pull-up code generation circuit 210, a second reference resistance forming circuit 220, a pull-up driver 230, a second pull-down code generation circuit 240, a first pull-down driver 250, a second pull-down driver 260, a first comparator 270, and a second comparator 280.

The second reference resistance forming circuit 220 may form a resistance of a second reference resistor, based on the first pull-up code Code_PU_1 included in the first code Code_1 that is provided by the first code generation circuit 100. To this end, according to an embodiment, the second reference resistance forming circuit 220 may include a multi driver (e.g., a multi pull-up driver) including a plurality of ZQ drivers (e.g., a plurality of ZQ pull-up drivers) connected to each other in parallel, each of the plurality of ZQ drivers may form the resistance of the first reference resistor, based on the first pull-up code Code_PU_1, and thus the second reference resistance forming circuit 220 may form the resistance of the second reference resistor that is less than the resistance of the first reference resistor. According to an embodiment, the resistance of the second reference resistor may correspond to a value obtained by dividing the resistance of the first reference resistor by the number of ZQ drivers. The second reference resistance forming circuit 220 will be described later in more detail with reference to FIG. 7.

According to an embodiment, when the second reference resistance forming circuit 220 includes a plurality of ZQ drivers, the plurality of ZQ drivers, the first pull-down driver 250, and the second pull-down driver 260 may each include at least one NMOS transistor. However, embodiments of the inventive concept are not limited thereto. According to an embodiment, the plurality of ZQ drivers, the first pull-down driver 250, and the second pull-down driver 260 may each include at least one PMOS transistor. However, embodiments of the inventive concept are not limited thereto. According to an embodiment, each of the plurality of ZQ drivers may include at least one PMOS transistor, and each of the first pull-down driver 250 and the second pull-down driver 260 may include at least one NMOS transistor.

According to an embodiment, each of the plurality of ZQ drivers may form an impedance, based on an n-bit code, and the first pull-down driver 250 and the second pull-down driver 260 and the pull-up driver 230 may form an impedance, based on a (n+k)-bit code.

The second comparator 280 may provide a fourth comparison result Comp_4 to the second pull-down code generation circuit 240 by comparing a voltage of a node Node_a between the second reference resistance forming circuit 220 and the first pull-down driver 250 with a reference voltage V_ref. The reference voltage V_ref may be provided by a reference voltage generation circuit within the impedance calibration circuit 10. According to an embodiment, the reference voltage V_ref may be a half of the driving voltage.

The second pull-down code generation circuit 240 may generate a second pull-down code Code_PD_2, based on the fourth comparison result Comp_4. The second pull-down code generation circuit 240 may provide a second pull-down code Code_PD_2 to the first pull-down driver 250 and the second pull-down driver 260, and may output the second pull-down code Code_PD_2 to the outside of the second code generation circuit 200a.

The first pull-down driver 250 may form an impedance, based on the second pull-down code Code_PD_2, and the second pull-down driver 260 may form an impedance, based on the second pull-down code Code_PD_2. Each of the first pull-down driver 250 and the second pull-down driver 260 may be implemented as the pull-down driver of FIG. 4. Through an operation of a closed loop including the second pull-down code generation circuit 240, the first pull-down driver 250, and the second comparator 280, the first pull-down driver 250 may consequently form the same impedance as the resistance of the second reference resistor, and the second pull-down driver 260 may also consequently form the same impedance as the resistance of the second reference resistor.

The first comparator 270 may provide a third comparison result Comp_3 to the second pull-up code generation circuit 210 by comparing a voltage of a node Node_b between the pull-up driver 230 and the second pull-down driver 260 with a reference voltage V_ref. The reference voltage V_ref may be provided by a reference voltage generation circuit within the impedance calibration circuit 10. According to an embodiment, the reference voltage V_ref may be a half of the driving voltage.

The second pull-up code generation circuit 210 may generate a second pull-up code Code_PU_2, based on the third comparison result Comp_3. The second pull-up code generation circuit 210 may provide the second pull-up code Code_PU_2 to the pull-up driver 230, and may output the second pull-up code Code_PU_2 to the outside of the second code generation circuit 200a.

The pull-up driver 230 may form an impedance, based on the second pull-up code Code_PU_2. The pull-up driver 230 may be implemented as the pull-up driver of FIG. 3. Through an operation of a closed loop including the second pull-up code generation circuit 210, the pull-up driver 230, and the first comparator 270, the pull-up driver 230 may consequently form the same impedance as the impedance value of the second pull-down driver 260. For example, the pull-up driver 230 may form the same impedance as the impedance value of the second reference resistor.

The second code generation circuit 200a may output the second pull-up code Code_PU_2 and the first pull-down code Code_PD_2 as the second code Code_2.

Figure 6:
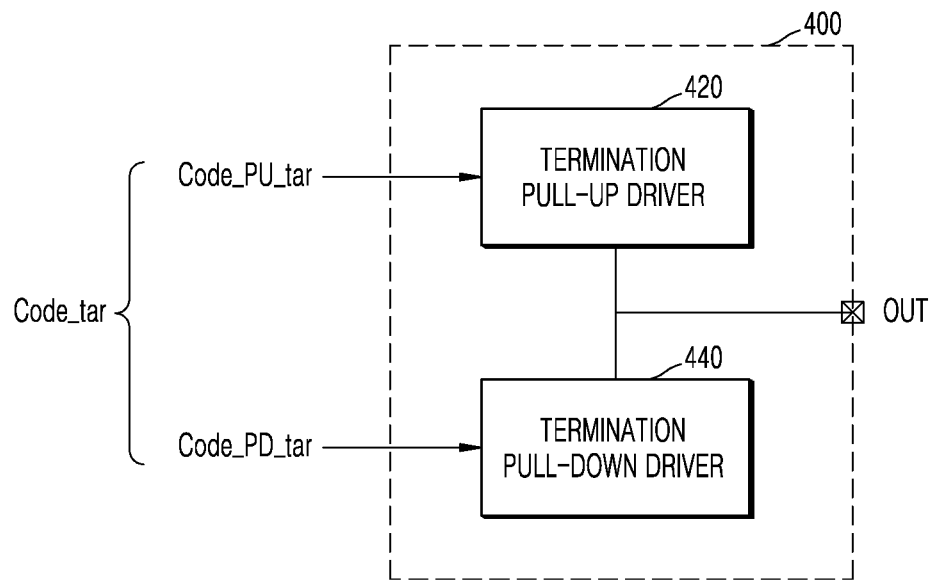
FIG. 6 is a circuit diagram of a termination driver according to an embodiment of the inventive concept.

FIG. 6 is a block diagram of a termination driver 400 according to an embodiment of the inventive concept. The termination driver 400 may correspond to the termination driver 400 of FIG. 1. FIG. 6 will now be described with reference to FIG. 1.

The termination driver 400 may include a termination pull-up driver 420 and a termination pull-down driver 440.

The termination pull-up driver 420 may form a termination pull-up impedance, based on a target impedance pull-up code Code_PU tar included in the target impedance code Code_tar. According to an embodiment, the termination pull-up driver 420 may be implemented as the pull-up driver of FIG. 3, and, in more detail, may be implemented in a type in which the connection node Node_con of FIG. 3 is connected to the output terminal OUT.

The termination pull-down driver 440 may form a termination pull-down impedance, based on a target impedance pull-down code Code_PD tar included in the target impedance code Code_tar. According to an embodiment, the termination pull-down driver 440 may be implemented as the pull-down driver of FIG. 4, and, in more detail, may be implemented in a form in which the connection node Node_con of FIG. 4 is connected to the output terminal OUT.

As the termination pull-up driver 420 forms a pull-up impedance in the output terminal OUT, based on the target impedance pull-up code Code_PU tar, and the termination pull-down driver 440 forms a pull-down impedance in the output terminal OUT, based on the target impedance pull-down code Code_PD tar, an impedance having the target impedance value R_tar may be formed in the output terminal OUT.

Figure 7:
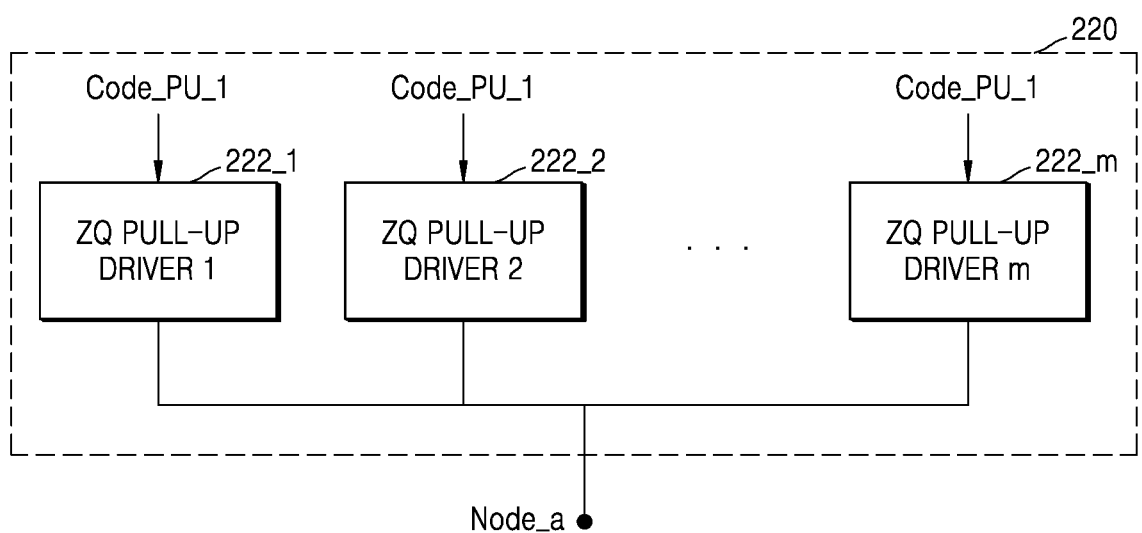
FIG. 7 is a block diagram of a second reference resistance forming circuit according to an embodiment of the inventive concept.

FIG. 7 is a block diagram of a second reference resistance forming circuit 220 according to an embodiment of the inventive concept. The second reference resistance forming circuit 220 of FIG. 7 may correspond to the second reference resistance forming circuit 220 of FIG. 5. FIG. 7 will now be described with reference to FIG. 1.

The second reference resistance forming circuit 220 may include a plurality of ZQ pull-up drivers, for example, first through m-th ZQ pull-up drivers 222_1 through 222_m (where m is a natural number equal to or greater than 2).

The first through m-th ZQ pull-up drivers 222_1 through 222_m may be connected to each other in parallel. Each of the first through m-th ZQ pull-up drivers 222_1 through 222_m may form an impedance, based on the first pull-up code Code_PU_1 that is provided by the first code generation circuit 100. Accordingly, each of the first through m-th ZQ pull-up drivers 222_1 through 222_m may form the same impedance value as the resistance of the first reference resistor. Thus, the second reference resistance forming circuit 220 may form the second reference resistor in the node Node_a, and the resistance of the second reference resistor may correspond to a value obtained by dividing the resistance of the first reference resistor by m. According to an embodiment, each of the first through m-th ZQ pull-up drivers 222_1 through 222_m may be implemented to have the same circuit structure as at least one ZQ pull-up driver included in the first code generation circuit 100. For example, the circuit structure of each of the first through m-th ZQ pull-up drivers 222_1 through 222_m may correspond to that of the at least one ZQ pull-up driver included in the first code generation circuit 100.

In some examples, the resistance value of the first reference resistor is 300 ohm. In this case, the resistance value of the second reference resistor may be 75 ohm when m is 4, and the resistance value of the second reference resistor may be 37.5 ohm when m is 8. Thus, the resistance value of the second reference resistor may have a wide range according to various values of m.

According to an embodiment, NMOS transistors respectively included in at least some of the plurality of ZQ pull-up drivers may have different turn-on resistances. According to an embodiment, the plurality of ZQ pull-up drivers may share a gate node.

According to an embodiment, the first ZQ pull-up driver 222_1 may include a first number of NMOS transistors connected to each other in parallel or in series, and the second ZQ pull-up driver 222_2 may include a second number of NMOS transistors connected to each other in parallel or in series, wherein the second number is different from the first number. According to an embodiment, the first number of NMOS transistors and the second number of NMOS transistors may have the same widths as each other. According to an embodiment, the first number of NMOS transistors may be connected to each other in parallel and may share a contact.

According to an embodiment, the NMOS transistors included in the plurality of ZQ pull-up drivers may have different widths or lengths from each other.

Figure 8:
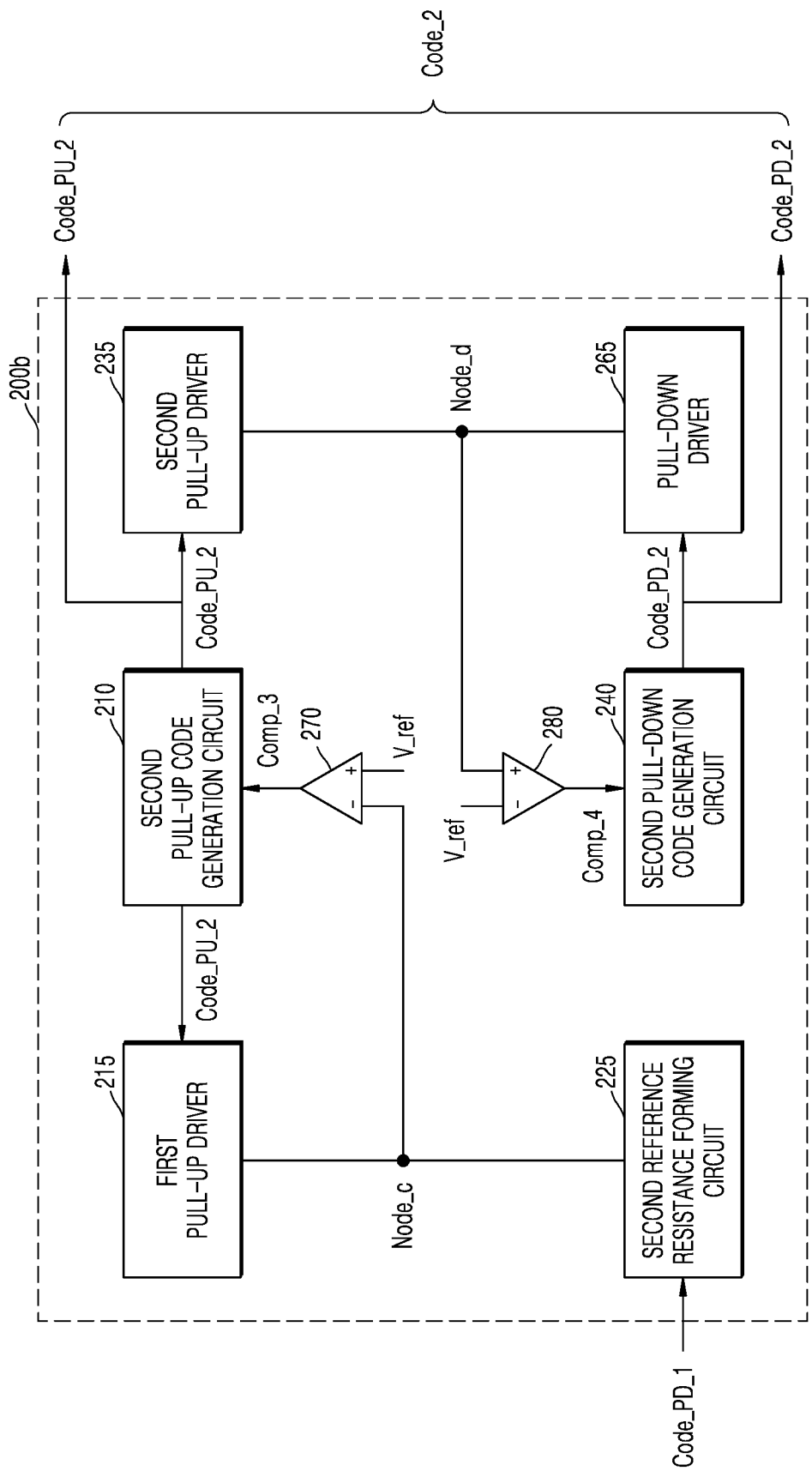
FIG. 8 is a block diagram of a second code generation circuit according to an embodiment of the inventive concept.

FIG. 8 is a block diagram of a second code generation circuit 200b according to an embodiment of the inventive concept. FIG. 8 will now be described with reference to FIG. 1. The second code generation circuit 200b may correspond to the second code generation circuit 200 of FIG. 1.

The second code generation circuit 200b may include a second pull-up code generation circuit 210, a second reference resistance forming circuit 225, a first pull-up driver 215, a second pull-up driver 235, a second pull-down code generation circuit 240, a pull-down driver 265, a first comparator 270, and a second comparator 280.

The second reference resistance forming circuit 225 may form a resistance of a second reference resistor, based on the first pull-down code Code_PD_1 included in the first code Code_1 that is provided by the first code generation circuit

100. To this end, according to an embodiment, the second reference resistance forming circuit 225 may include a multi driver (e.g., a multi pull-down driver) including a plurality of ZQ drivers (e.g., a plurality of ZQ pull-down drivers) connected to each other in parallel, each of the plurality of ZQ drivers may form the resistance of the first reference resistor, based on the first pull-down code Code_PD_1, and thus the second reference resistance forming circuit 225 may form the resistance of the second reference resistor that is less than the resistance of the first reference resistor. According to an embodiment, the resistance of the second reference resistor may correspond to a value obtained by dividing the resistance of the first reference resistor by the number of ZQ drivers. The second reference resistance forming circuit 225 will be described later in more detail with reference to FIG. 9.

The first comparator 270 may provide a third comparison result Comp_3 to the second pull-up code generation circuit 210 by comparing a voltage of a node Node_c between the second reference resistance forming circuit 225 and the first pull-up driver 215 with a reference voltage V_ref. The reference voltage V_ref may be provided by a reference voltage generation circuit within the impedance calibration circuit 10. According to an embodiment, the reference voltage V_ref may be a half of the driving voltage.

The second pull-up code generation circuit 210 may generate a second pull-up code Code_PU_2, based on the third comparison result Comp_3. The second pull-up code generation circuit 210 may provide the second pull-up code Code_PU_2 to the first pull-up driver 215 and the second pull-up driver 235, and may output the second pull-up code Code_PU_2 to the outside of the second code generation circuit 200b.

The first pull-up driver 215 may form an impedance, based on the second pull-up code Code_PU_2, and the second pull-up driver 235 may form an impedance, based on the second pull-up code Code_PU_2. Each of the first pull-up driver 215 and the second pull-up driver 235 may be implemented as the pull-up driver of FIG. 3. Through an operation of a closed loop including the second pull-up code generation circuit 210, the first pull-up driver 215, and the first comparator 270, the first pull-up driver 215 may consequently form the same impedance as the resistance of the second reference resistor, and the second pull-up driver 235 may also consequently form the same impedance as the resistance of the second reference resistor.

According to an embodiment, the first pull-up driver 215, the second pull-up driver 235 and the pull-down driver 265 may form an impedance, based on a (n+k)-bit code.

The second comparator 280 may provide a fourth comparison result Comp_4 to the second pull-down code generation circuit 240 by comparing a voltage of a node Node_d between the pull-down driver 265 and the second pull-up driver 235 with a reference voltage V_ref. The reference voltage V_ref may be provided by a reference voltage generation circuit within the impedance calibration circuit 10. According to an embodiment, the reference voltage V_ref may be a half of the driving voltage.

The second pull-down code generation circuit 240 may generate a second pull-down code Code_PD_2, based on the fourth comparison result Comp_4. The second pull-down code generation circuit 240 may provide the second pull-down code Code_PD_2 to the pull-down driver 265, and may output the second pull-down code Code_PD_2 to the outside of the second code generation circuit 200b.

The pull-down driver 265 may form an impedance, based on the second pull-down code Code_PD_2. The pull-down driver 265 may be implemented as the pull-down driver of FIG. 4. Through an operation of a closed loop including the second pull-down code generation circuit 240, the pull-down driver 265, and the second comparator 280, the pull-down driver 265 may consequently form the same impedance as the impedance value of the second pull-up driver 235. For example, the pull-down driver 265 may form the same impedance as the impedance value of the second reference resistor.

The second code generation circuit 200b may output the second pull-up code Code_PU_2 and the first pull-down code Code_PD_2 as the second code Code_2.

Figure 9:
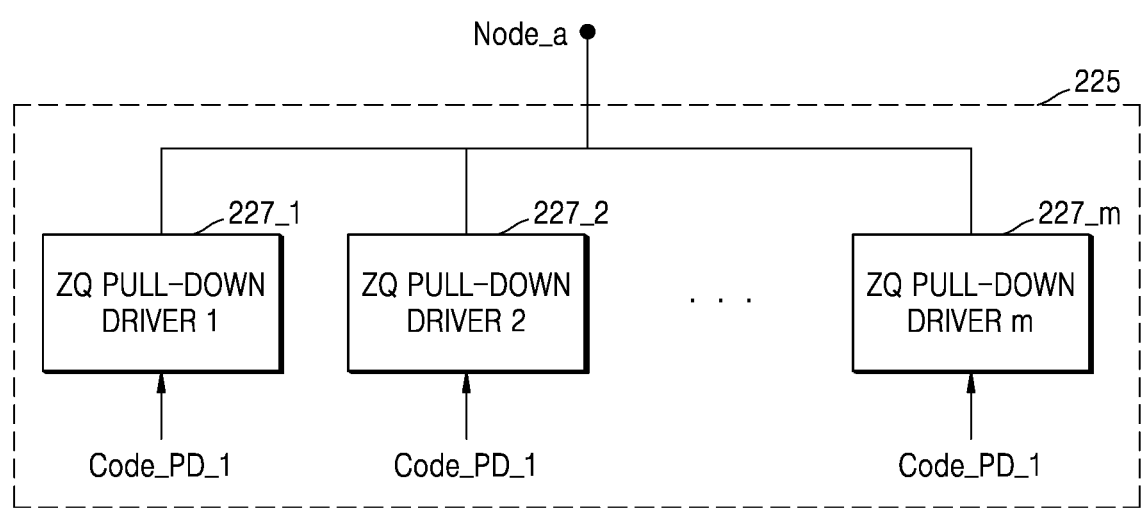
FIG. 9 is a block diagram of a second reference resistance forming circuit according to an embodiment of the inventive concept.

FIG. 9 is a block diagram of a second reference resistance forming circuit 225 according to an embodiment of the inventive concept. The second reference resistance forming circuit 225 of FIG. 9 may correspond to the second reference resistance forming circuit 225 of FIG. 8. FIG. 9 will now be described with reference to FIG. 1.

The second reference resistance forming circuit 225 may include a plurality of ZQ pull-down drivers, for example, first through m-th ZQ pull-down drivers 227_1 through 227_m (where m is a natural number equal to or greater than 2).

The first through m-th ZQ pull-down drivers 227_1 through 227_m may be connected to each other in parallel. Each of the first through m-th ZQ pull-down drivers 227_1 through 227_m may form an impedance, based on the first pull-down code Code_PD_1 that is provided by the first code generation circuit 100. Accordingly, each of the first through m-th ZQ pull-up drivers 227_1 through 227_m may form the same impedance value as the resistance of the first reference resistor. Thus, the second reference resistance forming circuit 225 may form the second reference resistor in the node Node_a, and the resistance of the second reference resistor may correspond to a value obtained by dividing the resistance of the first reference resistor by m. According to an embodiment, each of the first through m-th ZQ pull-down drivers 227_1 through 227_m may be implemented to have the same circuit structure as at least one ZQ pull-down driver included in the first code generation circuit 100. For example, according to an embodiment, the circuit structure of each of the first through m-th ZQ pull-down drivers 227_1 through 227_m may correspond to that of the at least one ZQ pull-down driver included in the first code generation circuit 100.

Figure 10:
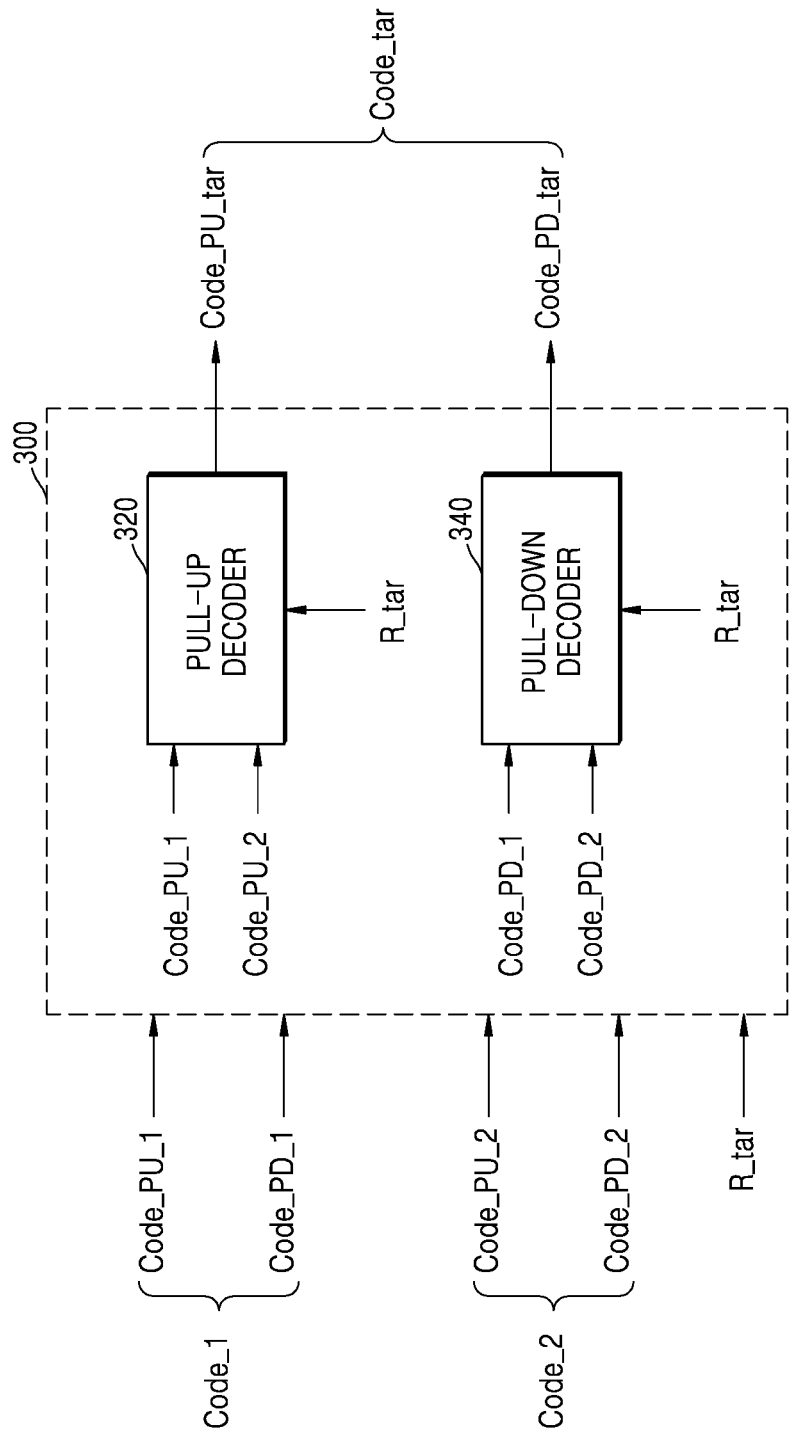
FIG. 10 is a block diagram of a target impedance code generation circuit according to an embodiment of the inventive concept.

FIG. 10 is a block diagram of a target impedance code generation circuit 300 according to an embodiment of the inventive concept. The target impedance code generation circuit 300 of FIG. 10 may correspond to the target impedance code generation circuit 300 of FIG. 1. FIG. 10 will now be described with reference to FIG. 1.

The target impedance code generation circuit 300 may include a pull-up decoder 320 and a pull-down decoder 340.

The first code Code_1 provided by the first code generation circuit 100 may include a first pull-up code Code_PU_1 and a first pull-down code Code_PD_1, and the second code Code_2 provided by the second code generation circuit 200 may include a second pull-up code Code_PU_2 and a second pull-down code Code_PD_2.

The pull-up decoder 320 may output a target impedance pull-up code Code_PU tar, based on the first pull-up code Code_PU_1, the second pull-up code Code_PU_2, and the target impedance value R_tar. The pull-up decoder 320 may compare the target impedance value R_tar with a threshold impedance value, and may generate the target impedance pull-up code Code_PU tar by performing an operation by using the first pull-up code Code_PU_1 and the second pull-up code Code_PU_2, based on a result of the comparison. For example, the pull-up decoder 320 may select one of the first pull-up code Code_PU_1 and the second pull-up code Code_PU_2, based on a result of the comparison, and may generate the target impedance pull-up code Code_PU tar, based on the selected code. The pull-up decoder 320 will be described later in more detail with reference to FIG. 11.

The pull-down decoder 340 may output the target impedance pull-down code Code_PD tar, based on the first pull-down code Code_PD_1, the second pull-down code Code_PD_2, and the target impedance value R_tar. The pull-down decoder 340 may compare the target impedance value R_tar with a threshold impedance value, and may generate the target impedance pull-down code Code_PD tar by performing an operation by using the first pull-down code Code_PD_1 and the second pull-down code Code_PD_2, based on a result of the comparison. For example, the pull-down decoder 340 may select one of the first pull-down code Code_PD_1 and the second pull-down code Code_PD_2, based on a result of the comparison, and may generate the target impedance pull-down code Code_PD tar, based on the selected code. The pull-down decoder 340 will be described later in more detail with reference to FIG. 12.

The target impedance code generation circuit 300 may output the target impedance pull-up code Code_PU tar and the target impedance pull-down code Code_PD tar as the target impedance code Code_tar.

The target impedance code generation circuit 300 may be implemented in various types. According to an embodiment, the target impedance code generation circuit 300 may be implemented as hardware or software. When the target impedance code generation circuit 300 is implemented as hardware, the target impedance code generation circuit 300 may include circuits for generating the target impedance code Code_tar, based on the first code Code_1 and the second code Code_2. For example, when the target impedance code generation circuit 300 is implemented as software, a program and/or instructions loaded on an arbitrary memory within a device where the impedance calibration circuit 10 is implemented may be executed by an arbitrary processor within the device to thereby generate the target impedance code Code_tar. However, embodiments of the inventive concept are not limited thereto. For example, the target impedance code generation circuit 300 may be implemented as a combination of software and firmware, such as firmware.

Figure 11:
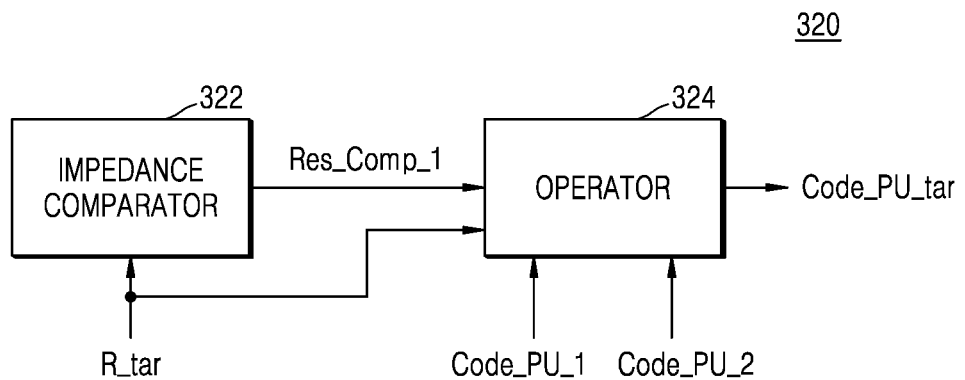
FIG. 11 is a circuit diagram of a pull-up decoder according to an embodiment of the inventive concept.

FIG. 11 is a block diagram of a pull-up decoder 320 according to an embodiment of the inventive concept. The pull-up decoder 320 of FIG. 11 may correspond to the pull-up decoder 320 of FIG. 10. FIG. 11 will now be described with reference to FIGS. 1 and 10.

The pull-up decoder 320 may include an impedance comparator 322 and an operator 324 (as used herein, an "operator" may refer to an "operator circuit").

The impedance comparator 322 may output a first impedance comparison result Res_Comp_1 by comparing the target impedance value R_tar with a threshold impedance value. As a non-restrictive example, when the target impedance value R_tar is greater than the threshold impedance value, the impedance comparator 322 may output a first impedance comparison result Res_Comp_1 having a first logic level (e.g., '1'), and, when the target impedance value R_tar is less than the threshold impedance value, the impedance comparator 322 may output a first impedance comparison result Res_Comp_1 having a second logic level (e.g., '0'). According to an embodiment, the threshold impedance value may be less than the resistance of the first reference resistor and may be greater than the resistance of the second reference resistor.

In example embodiments, the impedance comparator 322 may be omitted.

The operator 324 may select one from the first pull-up code Code_PU_1 and the second pull-up code Code_PU_2 according to the logic level of the first impedance comparison result Res_Comp_1, and may generate the target impedance pull-up code Code_PU tar by performing an operation by using the selected code. The operation may include a shift operation.

In example embodiments, when the target impedance value R_tar is greater than the threshold impedance value, the operator 324 may select the first pull-up code Code_PU_1 and may generate the target impedance pull-up code Code_PU tar by using the first pull-up code Code_PU_1.

In example embodiments, when the impedance comparator 322 is omitted and the target impedance value R_tar is closer to the resistance of the first reference resistor than the resistance of the second reference resistor, the operator 324 may select the first pull-up code Code_PU_1 and may generate the target impedance pull-up code Code_PU tar by using the first pull-up code Code_PU_1.

According to an embodiment, when the target impedance value R_tar is the same as the resistance of the first reference resistor, the operator 324 may output the first pull-up code Code_PU_1 as the target impedance pull-up code Code_PU tar. According to an embodiment, when the target impedance value R_tar is different from the resistance of the first reference resistor, the operator 324 may generate the target impedance pull-up code Code_PU tar by performing an operation of shifting the first pull-up code Code_PU_1 by at least one bit. As a non-restrictive example for convenience of explanation, when the resistance of the first reference resistor is 300 ohm and the target impedance value R_tar is 150 ohm, the operator 324 may generate the target impedance pull-up code Code_PU tar by 1-bit shifting the first pull-up code Code_PU_1.

In an embodiment, when the first pull-up code Code_PU_1 shifts left once, an impedance may be half of an impedance corresponding to the previous first pull-up code Code_PU_1, and when the first pull-up code Code_PU_1 shifts left twice, an impedance may be ¼ of the impedance corresponding to the previous first pull-up code Code_PU_1.

In an embodiment, when the first pull-up code Code_PU_1 shifts right once, an impedance may be two times of the impedance corresponding to the previous first pull-up code Code_PU_1, and when the first pull-up code Code_PU_1 shifts right twice, an impedance may be 4 times of the impedance corresponding to the previous first pull-up code Code_PU_1.

Similarly, in example embodiments, when the target impedance value R_tar is less than the threshold impedance value, the operator 324 may select the second pull-up code Code_PU_2 and may generate the target impedance pull-up code Code_PU tar by using the second pull-up code Code_PU_2.

In example embodiments, when the impedance comparator 322 is omitted and the target impedance value R_tar is closer to the resistance of the second reference resistor than the resistance of the first reference resistor, the operator 324 may select the second pull-up code Code_PU_2 and may generate the target impedance pull-up code Code_PU tar by using the second pull-up code Code_PU_2.

According to an embodiment, when the target impedance value R_tar is the same as the resistance of the second reference resistor, the operator 324 may output the second pull-up code Code_PU_2 as the target impedance pull-up code Code_PU tar. According to an embodiment, when the target impedance value R_tar is different from the resistance of the second reference resistor, the operator 324 may generate the target impedance pull-up code Code_PU tar by performing an operation of shifting the second pull-up code Code_PU_2 by at least one bit. As a non-restrictive example for convenience of explanation, when the resistance of the second reference resistor is 75 ohm and the target impedance value R_tar is 37.5 ohm, the operator 324 may generate the target impedance pull-up code Code_PU tar by 1-bit shifting the second pull-up code Code_PU_2. As a non-restrictive example for convenience of explanation, when the resistance of the second reference resistor is 75 ohm and the target impedance value R_tar is 25 ohm, the operator 324 may generate the target impedance pull-up code Code_PU tar by performing an operation of adding the second pull-up code Code_PU_2 to a code obtained by 1-bit shifting the second pull-up code Code_PU_2.

In some examples, when the second pull-up code Code_PU_2 shifts left once, an impedance may be half of an impedance corresponding to the previous second pull-up code Code_PU_2, and when the second pull-up code Code_PU_2 shifts left twice, an impedance may be ¼ of the impedance corresponding to the previous second pull-up code Code_PU_2.

In some examples, when the second pull-up code Code_PU_2 shifts right once, an impedance may be 2 times of the impedance corresponding to the previous second pull-up code Code_PU_2, and when the second pull-up code Code_PU_2 shifts right twice, an impedance may be 4 times of the impedance corresponding to the previous second pull-up code Code_PU_2.

Figure 12:
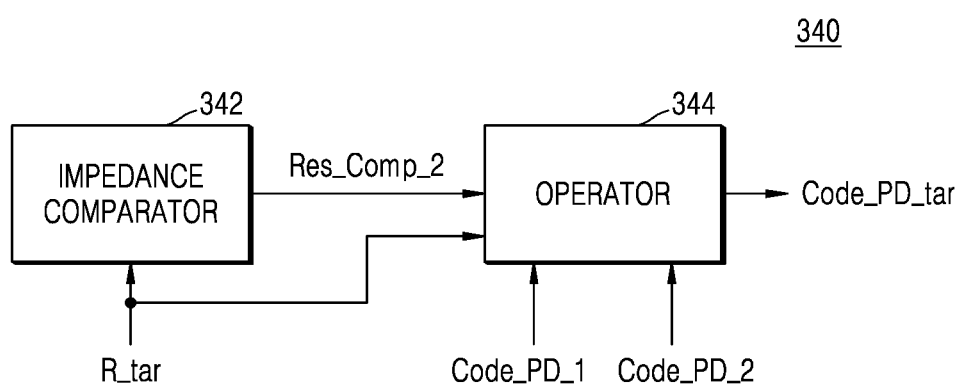
FIG. 12 is a circuit diagram of a pull-down decoder according to an embodiment of the inventive concept.

FIG. 12 is a block diagram of a pull-down decoder 340 according to an embodiment of the inventive concept. The pull-down decoder 340 of FIG. 12 may correspond to the pull-down decoder 340 of FIG. 10. FIG. 12 will now be described with reference to FIGS. 1 and 10.

The pull-down decoder 340 may include an impedance comparator 342 and an operator 344 (as used herein, an "operator" may refer to an "operator circuit").

The impedance comparator 342 may output a second impedance comparison result Res_Comp_2 by comparing the target impedance value R_tar with a threshold impedance value. As a non-restrictive example, when the target impedance value R_tar is greater than the threshold impedance value, the impedance comparator 342 may output a second impedance comparison result Res_Comp_2 having a first logic level (e.g., '1'), and, when the target impedance value R_tar is less than the threshold impedance value, the impedance comparator 342 may output a second impedance comparison result Res_Comp_2 having a second logic level (e.g., '0'). According to an embodiment, the threshold impedance value may be less than the resistance of the first reference resistor and may be greater than the resistance of the second reference resistor.

In example embodiments, the impedance comparator 342 may be omitted.

The operator 344 may select one from among the first pull-down code Code_PD_1 and the second pull-down code Code_PD_2 according to the logic level of the second impedance comparison result Res_Comp_2, and may generate the target impedance pull-down code Code_PD tar by performing an operation by using the selected code. The operation may include a shift operation.

For example, when the target impedance value R_tar is greater than the threshold impedance value, the operator 344 may select the first pull-down code Code_PD_1 and may generate the target impedance pull-down code Code_PD tar by using the first pull-down code Code_PD_1. According to an embodiment, when the target impedance value R_tar is the same as the resistance of the first reference resistor, the operator 344 may output the first pull-down code Code_PD_1 as the target impedance pull-down code Code_PD tar. According to an embodiment, when the target impedance value R_tar is different from the resistance of the first reference resistor, the operator 344 may generate the target impedance pull-up code Code_PD tar by performing an operation of shifting the first pull-down code Code_PD_1 by at least one bit. As a non-restrictive example for convenience of explanation, when the resistance of the first reference resistor is 300 ohm and the target impedance value R_tar is 150 ohm, the operator 344 may generate the target impedance pull-down code Code_PD tar by 1-bit shifting the first pull-down code Code_PD_1.

In some examples, when the first pull-down code Code_PD_1 shifts left once, an impedance may be half of an impedance corresponding to the previous first pull-down code Code_PD_1, and when the first pull-down code Code_PD_1 shifts left twice, an impedance may be ¼ of the impedance corresponding to the previous first pull-down code Code_PD_1.

In some examples, when the first pull-down code Code_PD_1 shifts right once, an impedance may be two times of the impedance corresponding to the previous first pull-down code Code_PD_1, and when the first pull-down code Code_PD_1 shifts right twice, an impedance may be 4 times of the impedance corresponding to the previous first pull-down code Code_PD_1.

Similarly, for example, when the target impedance value R_tar is less than the threshold impedance value, the operator 344 may select the second pull-down code Code_PD_2 and may generate the target impedance pull-down code Code_PD tar by using the second pull-down code Code_PD_2. According to an embodiment, when the target impedance value R_tar is the same as the resistance of the second reference resistor, the operator 344 may output the second pull-down code Code_PD_2 as the target impedance pull-down code Code_PD tar. According to an embodiment, when the target impedance value R_tar is different from the resistance of the second reference resistor, the operator 344 may generate the target impedance pull-down code Code_PD tar by performing an operation of shifting the second pull-down code Code_PD_2 by at least one bit. As a non-restrictive example for convenience of explanation, when the resistance of the second reference resistor is 75 ohm and the target impedance value R_tar is 37.5 ohm, the operator 344 may generate the target impedance pull-down code Code_PD tar by 1-bit shifting the second pull-down code Code_PD_2. As a non-restrictive example for convenience of explanation, when the resistance of the second reference resistor is 75 ohm and the target impedance value R_tar is 25 ohm, the operator 344 may generate the target impedance pull-down code Code_PD tar by performing an operation of adding the second pull-down code Code_PD_2 to a code obtained by 1-bit shifting the second pull-down code Code_PD_2.

In some examples, when the second pull-down code Code_PD_2 shifts left once, an impedance may be half of an impedance corresponding to the previous second pull-down code Code_PD_2, and when the second pull-down code Code_PD_2 shifts left twice, an impedance may be ¼ of the impedance corresponding to the previous second pull-down code Code_PD_2.

In some examples, when the second pull-down code Code_PD_2 shifts right once, an impedance may be 2 times of the impedance corresponding to the previous second pull-down code Code_PD_2, and when the second pull-down code Code_PD_2 shifts right twice, an impedance may be 4 times of the impedance corresponding to the previous second pull-down code Code_PD_2.

Figure 13:
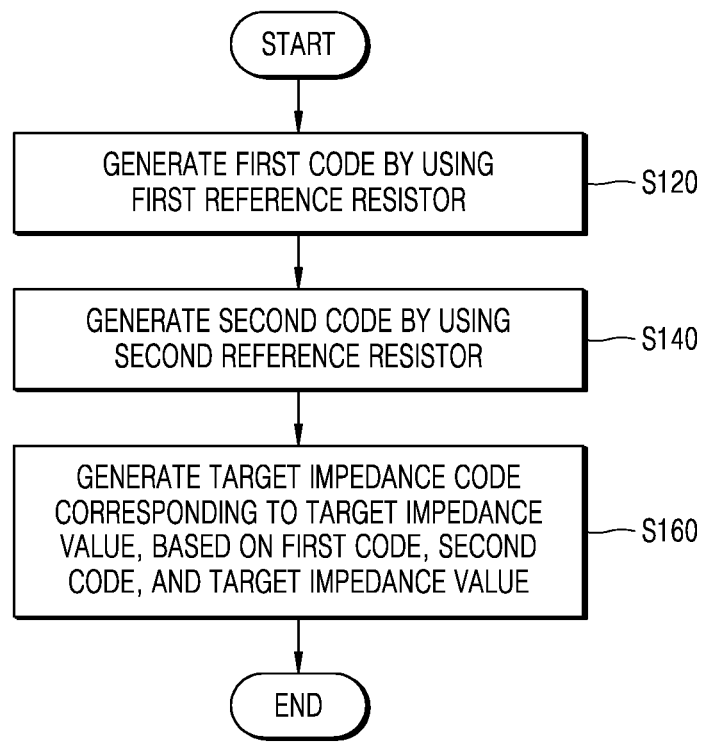
FIG. 13 is a flowchart of an impedance calibration method performed by an impedance calibration circuit, according to an embodiment of the inventive concept.

FIG. 13 is a flowchart of an impedance calibration method performed by an impedance calibration circuit, according to an embodiment of the inventive concept. FIG. 13 will now be described with reference to FIG. 1.

In operation S120, the impedance calibration circuit 10 may generate the first code Code_1 by using the first reference resistor. For example, the first code generation circuit 100 may generate the first code Code_1 by using the first reference resistor, which is the external resistor R_ZQ connected to the ZQ pin ZQ. The first code Code_1 may indicate a code for forming the resistance of the first reference resistor. The first code Code_1 may include a first pull-up code and a first pull-down code.

In operation S140, the impedance calibration circuit 10 may generate the second code Code_2 by using the second reference resistor. For example, the second code generation circuit 200 may form the resistance of the second reference resistor having a smaller resistance than the resistance of the first reference resistor, based on the first code Code_1, and may generate the second code Code_2 by using the second reference resistor. The second code Code_2 may indicate a code for forming the resistance of the second reference resistor. The second code Code_2 may include a second pull-up code and a second pull-down code.

In operation S160, the impedance calibration circuit 10 may generate the target impedance code Code_tar corresponding to the target impedance value R_tar, based on the first code Code_1, the second code Code_2, and the target impedance value R_tar. For example, the target impedance code generation circuit 300 may compare the target impedance value R_tar with the threshold impedance value, and may select one from among the first code Code_1 and the second code Code_2 according to a result of the comparison. The target impedance code generation circuit 300 may generate the target impedance code Code_tar by performing an operation by using the selected code.

Figure 14:
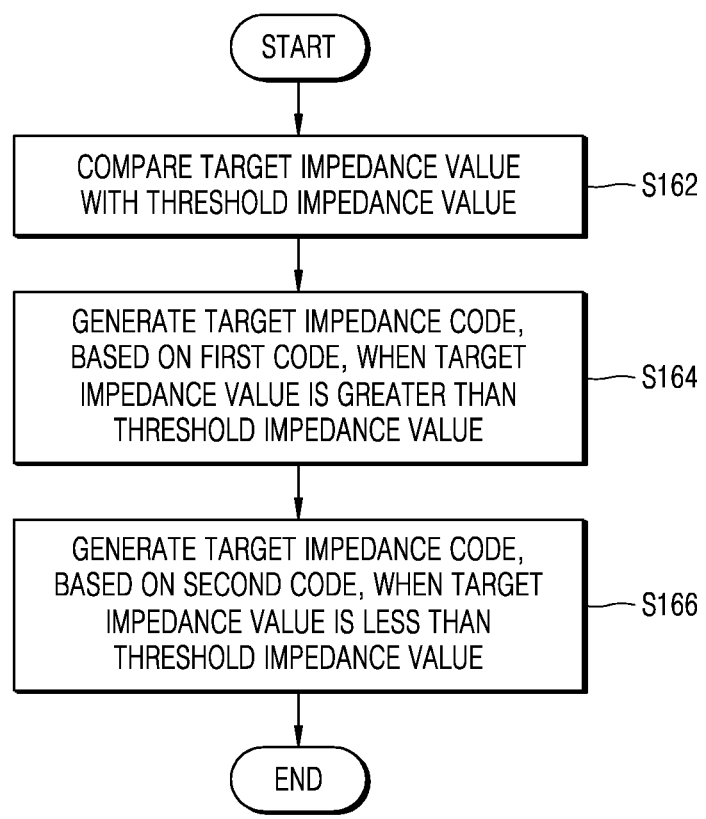
FIG. 14 is a flowchart of an impedance calibration method performed by an impedance calibration circuit, according to an embodiment of the inventive concept.

FIG. 14 is a flowchart of an impedance calibration method performed by an impedance calibration circuit, according to an embodiment of the inventive concept. FIG. 14 may be a flowchart of operation S160 of FIG. 13. FIG. 14 will now be described with reference to FIG. 1.

In operation S162, the impedance calibration circuit 10 may compare the target impedance value R_tar with the threshold impedance value. For example, the target impedance code generation circuit 300 may generate an impedance comparison result by comparing the target impedance value R_tar with the threshold impedance value.

In operation S164, when the target impedance value R_tar is greater than the threshold impedance value, the impedance calibration circuit 10 may select the first code Code_1, and may generate the target impedance code Code_tar, based on the first code Code_1.

In operation S166, when the target impedance value R_tar is less than the threshold impedance value, the impedance calibration circuit 10 may select the second code Code_2, and may generate the target impedance code Code_tar, based on the second code Code_2.

FIG. 15 is a block diagram of a memory device 1000 according to an embodiment of the inventive concept. In particular, FIG. 15 illustrates the memory device 1000 in which the impedance calibration circuit 10 described above with reference to FIGS. 1, 2A, 2B, and 3 through 14 is implemented.

The memory device 1000 may be implemented using a volatile memory device or a nonvolatile memory device. The volatile memory device may include, for example, dynamic random access memory (DRAM) and static random access memory (SRAM). The nonvolatile memory device may include, for example, a NAND flash memory, a vertical NAND (VNAND) flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), and a combination thereof. According to an embodiment, the nonvolatile memory device may have a stack structure of 100 or more layers. According to an embodiment, the nonvolatile memory device may have a Cell-on-Peri or Cell-over-Peri (COP) structure.

According to an embodiment, an operational frequency of the memory device 1000 may be, but is not limited to, 1.2 GHz or greater.

The memory device 1000 may include a first code generation circuit 1100, a second code generation circuit 1200, a target impedance code generation circuit 1300, and a termination driver 1400.

The first code generation circuit 1100 may correspond to the first code generation circuits 100, 100a, and 100b described above with reference to FIGS. 1, 2A, 2B, and 3 through 14. For example, the first code generation circuit 1100 may generate the first pull-up code Code_PU_1 and the first pull-down code Code_PD_1 by using the external resistor R_ZQ connected to the ZQ pin ZQ.

The second code generation circuit 1200 may correspond to the second code generation circuits 200, 200a, and 200b described above with reference to FIGS. 1, 2A, 2B, and 3 through 14. For example, the second code generation circuit 1200 may generate the second pull-up code Code_PU_2 and the second pull-down code Code_PD_2 by using the second reference resistor formed based on the first pull-up code Code_PU_1 and/or the first pull-down code Code_PD_1.

The target impedance code generation circuit 1300 may correspond to the target impedance code generation circuit 300 described above with reference to FIGS. 1, 2A, 2B, and 3 through 14. For example, the target impedance code generation circuit 1300 may generate the target impedance pull-up code Code_PU tar and the target impedance pull-down code Code_PD tar, based on the first pull-up code Code_PU_1, the first pull-down code Code_PD_1, the second pull-up code Code_PU_2, the second pull-down code Code_PD_2, and the target impedance value R_tar.

The termination driver 1400 may correspond to the termination driver 400 described above with reference to FIGS. 1, 2A, 2B, and 3 through 14. Each of a first DQ pin DQ_1 through an N-th DQ pin DQ_N may correspond to the output terminal OUT described above with reference to FIGS. 1, 2A, 2B, and 3 through 14, each of a first termination pull-up driver 1420_1 through an N-th termination pull-up driver 1420_N may correspond to the termination pull-up driver 420 of FIG. 6, and each of a first termination pull-down driver 1440_1 through an N-th termination pull-down driver 1440_N may correspond to the termination pull-down driver 440 of FIG. 6. Although FIG. 15 illustrates an embodiment in which the termination driver 1400 is connected to DQ pins, embodiments of the inventive concept are not limited thereto, and the termination driver 1400 may be connected to a DQS pin.

In example embodiments, a circuit structure of each of the first termination pull-up driver 1420_1 through an N-th termination pull-up driver 1420_N may be the same as a circuit structure of each of the pull-up driver 230 of FIG. 5 and the first pull-up driver 215 and a second pull-up driver 235 of FIG. 8. A circuit structure of each of the each of the first termination pull-down driver 1440_1 through an N-th termination pull-down driver 1440_N may be the same as a circuit structure of each of the first pull-down driver 250 and the second pull-down driver 260 of FIG. 5 and the pull-down driver 265 of FIG. 8.

The memory device 1000 may transmit or receive data through the first DQ pin DQ_1 through the N-th DQ pin DQ_N.

The memory device 1000 according to an embodiment of the inventive concept may generate the target impedance pull-up code Code_PU tar and the target impedance pull-down code Code_PD tar for forming the target impedance value R_tar, based on the first pull-up code Code_PU_1 and the first pull-down code Code_PD_1 formed using the first reference resistor and the second pull-up code Code_PU_2 and the second pull-down code Code_PD_2 formed using the first reference resistor. A memory device according to a first comparative example that generates a target impedance code, based on a code formed using one reference resistor, needs to perform an operation of shifting a code by a large number of bits in order to cover a wide-range target impedance value. This causes non-linearity between the code and the impedance value of a termination impedance. Compared with the impedance calibration circuit according to the first comparative example, the memory device 1000 according to an embodiment of the inventive concept may maintain linearity between a code and an impedance value, with respect to a target impedance value R_tar in a wide range, by generating a target impedance code, based on a first code formed using a first reference resistor and a second code formed using a second reference resistor that is smaller than the first reference resistor. For example, the memory device 1000 according to an embodiment of the inventive concept may provide a reliable termination impedance for the wide range of the target impedance value R_tar.

In addition, in the memory device 1000 according to an embodiment of the inventive concept, instead that a plurality of ZQ drivers that occupy a relatively wide area and have a wide capacitance are respectively connected to the plurality of DQ pins DQ_1 through DQ_N, the plurality of ZQ drivers are included in the second code generation circuit 1200, and thus, compared with a comparative example in which a plurality of drivers are connected to an output terminal, the driver area and capacitance of drivers respectively connected to the plurality of DQ pins DQ_1 through DQ_N may be reduced.

Figure 16:
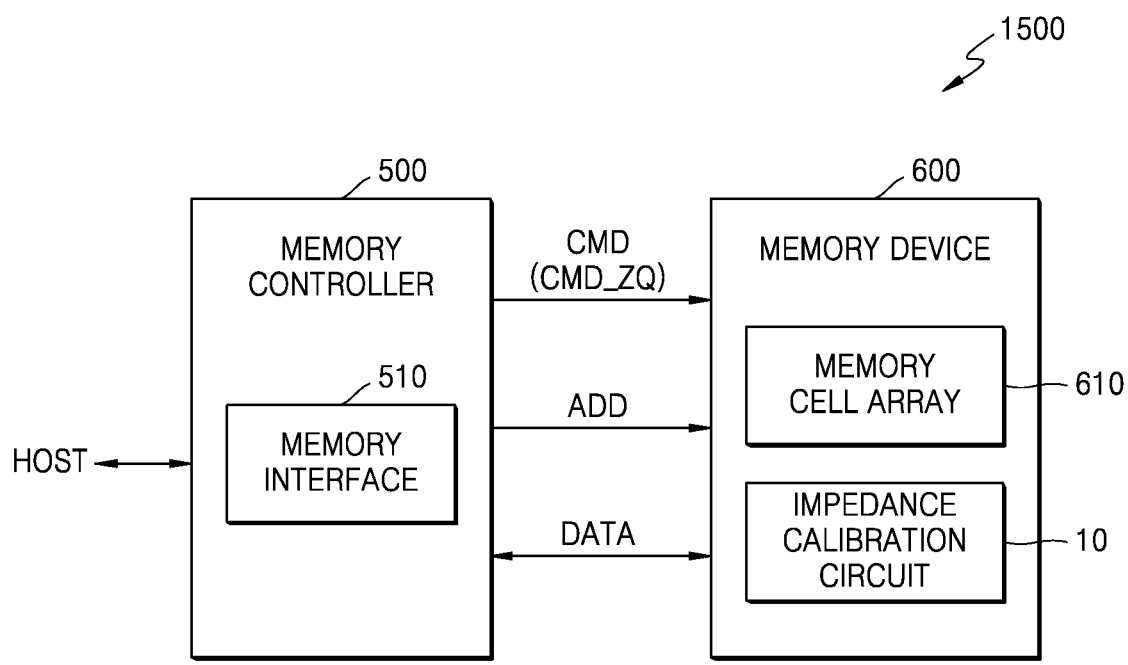
FIG. 16 is a block diagram of a memory system according to an exemplary embodiment of the inventive concept.

FIG. 16 is a block diagram of a memory system according to an exemplary embodiment of the inventive concept.

Referring to FIG. 16, a memory system 1500 may include a memory controller 500 and a memory device 600. The memory controller 500 provides various types of signals to the memory device 600 to control memory operations such as write and read operations. For example, the memory controller 500 includes a memory interface 510 and provides a command CMD and an address ADD to the memory device 600 to access data DATA in a memory cell array 610 of the memory device 600.

The command CMD may include a command for normal memory operations such as write and read operations. In addition, the memory controller 500 may provide the command CMD for various types of control operations in the memory device 600, for example, provide a calibration command CMD ZQ to the memory device 600.

The memory controller 500 may access the memory device 600 in response to a request from a host. The memory controller 500 may communicate with the host by using various protocols.

The memory device 600 may include the memory cell array 610 and an impedance calibration circuit 10. For a memory operation, the memory device 600 may further include other various components.

In example embodiments, the memory device 600, such as described in FIG. 16, can operate and can include device components according to one or more of the example embodiments described previously.

Figure 17:
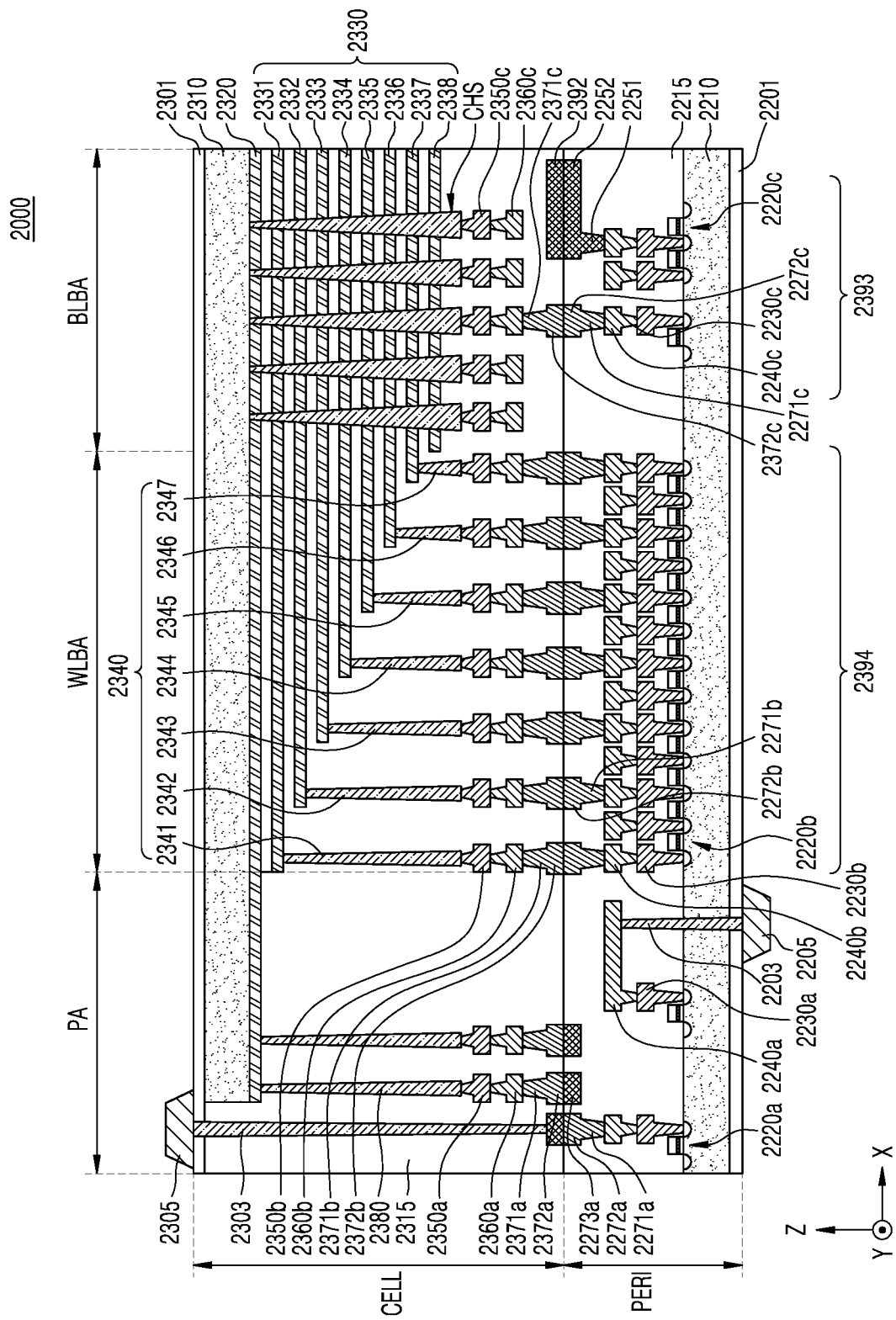
FIG. 17 is a cross-sectional view illustrating a memory device according to exemplary embodiments of the inventive concept.

FIG. 17 is a cross-sectional view illustrating a memory device according to exemplary embodiments of the inventive concept.

Referring to FIG. 17, a memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a word line bonding area WLBA, and a bit line bonding area BLBA. In example embodiments, the memory cell array 610 of FIG. 16 may be located in the cell region CELL of FIG. 17 and the impedance calibration circuit 10 of FIG. 16 may be located in the peripheral circuit region PERI of FIG. 17.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrate in FIG. 17, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to c in a bonding manner, and the lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a third metal layer 2350c and a fourth metal layer 2360c. For example, the third metal layer 2350c may be a bit line contact, and the fourth metal layer 2360c may be a bit line. In an example embodiment, the bit line 2360c may extend in a first direction (a Y-axis direction), parallel to the upper surface of the second substrate 2310.

In an example embodiment illustrated in FIG. 17, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A third metal layer 2350b and a fourth metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERIin the word line bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A third metal layer 2350a and a fourth metal layer 2360a may be stacked on an upper portion of the common source line contact plug 2380, sequentially. For example, an area in which the common source line contact plug 2380, the third metal layer 2350a, and the fourth metal layer 2360a are disposed may be defined as the external pad bonding area PA.

Input-output pads 2205 and 2305 may be disposed in the external pad bonding area PA. Referring to FIG. 17, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and the first input-output pad 2205 may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 17, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 17, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305 and an upper metal pattern 2372*a* of the cell region CELL.

According to embodiments, the first input-output pad 2205 and the second input-output pad 2305 may be selectively formed. For example, the memory device 2000 may include only the first input-output pad 2205 disposed on the lower insulating film 2201 in contact with the first substrate 2210 or the second input-output pad 2305 disposed on the upper insulating film 2301 in contact with the second substrate 2310. Alternatively, the memory device 2000 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2273*a*, corresponding to the upper metal pattern 2372*a* formed in an uppermost metal layer of the cell region CELL, and having the same shape as the upper metal pattern 2372*a* of the cell region CELL, in an uppermost metal layer of the peripheral circuit region PERI. In the peripheral circuit region PERI, the lower metal pattern 2273*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271*b* and 2272*b* may be formed on the second metal layer 2240*b* in the word line bonding area WLBA. In the word line bonding area WLBA, the lower bonding metals 2271*b* and 2272*b* of the peripheral circuit region PERI may be electrically connected to the upper bonding metals 2371*b* and 2372*b* of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In example embodiments, the memory device 2000, such as described in FIG. 17, can operate and can include device components according to one or more of the example embodiments described previously. In example embodiments, the memory cell array 610 of FIG. 16 may be located in the cell region CELL of FIG. 17 and the impedance calibration circuit 10 of FIG. 16 may be located in the peripheral circuit region PERI of FIG. 17. For example, the impedance calibration circuits described in FIGS. 1, 2A, 2B, 3 to 12, and 15 may be located in the peripheral circuit region PERI of FIG. 17.

While the inventive concept has been particularly shown and described with reference to embodiments thereof, it will be understood that various changes in form and details may be made therein without departing from the spirit and scope of the following claims.

What is claimed is:

1. An impedance calibration circuit comprising:
   a first code generation circuit connected to a first reference resistor, and configured to generate a first code for forming a resistance based on the first reference resistor, by using the first reference resistor;
   a second code generation circuit configured to:
   form a resistance of a second reference resistor less than the resistance of the first reference resistor, based on the first code, and
   generate a second code by using the second reference resistor; and
   a target impedance code generation circuit configured to:
   generate a target impedance code based on the first code, the second code, and a target impedance value, and
   form an impedance having the target impedance value in a termination driver connected to the impedance calibration circuit, based on the target impedance code.

2. The impedance calibration circuit of claim 1, wherein the target impedance code generation circuit is configured to:
   compare the target impedance value with a threshold impedance value, and
   generate the target impedance code based on a code selected from the first code and the second code according to a result of the comparing.

3. The impedance calibration circuit of claim 2, wherein the target impedance code generation circuit is configured to:
   when the target impedance value is greater than the threshold impedance value, either generate the first code as the target impedance code or generate the target impedance code by shifting the first code, and
   when the target impedance value is less than the threshold impedance value, either generate the second code as the target impedance code or generate the target impedance code by shifting the second code.

4. The impedance calibration circuit of claim 1, wherein the target impedance code generation circuit comprises:
   an impedance comparator configured to output a comparison result by comparing the target impedance value with a threshold impedance value; and
   an operator circuit configured to generate the target impedance code, based on a code selected from the first code and the second code according to a result of the comparing.

5. The impedance calibration circuit of claim 1, wherein the first code generation circuit comprises:
   at least one ZQ pull-up driver configured to form a first pull-up impedance, based on a first pull-up code included in the first code; and
   at least one ZQ pull-down driver configured to form a first pull-down impedance, based on a first pull-down code included in the first code.

6. The impedance calibration circuit of claim 5, wherein the second code generation circuit comprises:

a second reference resistance forming circuit configured to form a resistance of the second reference resistor, based on the first pull-up code or the first pull-down code;

at least one pull-up driver configured to form a second pull-up impedance, based on a second pull-up code included in the second code; and at least one pull-down driver configured to form a second pull-down impedance, based on a second pull-down code included in the second code.

7. The impedance calibration circuit of claim 6, wherein the second reference resistance forming circuit comprises a plurality of ZQ pull-up drivers connected to each other in parallel, and each of the plurality of ZQ pull-up drivers is configured to form an impedance value that is the same as the first pull-up impedance, based on the first pull-up code.

8. The impedance calibration circuit of claim 6, wherein the second reference resistance forming circuit comprises a plurality of ZQ pull-down drivers connected to each other in parallel, and each of the plurality of ZQ pull-down drivers is configured to form an impedance value that is the same as the first pull-down impedance, based on the first pull-down code.

9. The impedance calibration circuit of claim 6, wherein the target impedance code generation circuit comprises:

a pull-up decoder configured to generate a target impedance pull-up code included in the target impedance code, based on the first pull-up code, the second pull-up code, and the target impedance value; and a pull-down decoder configured to generate a target impedance pull-down code included in the target impedance code, based on the first pull-down code, the second pull-down code, and the target impedance value.

10. The impedance calibration circuit of claim 9, wherein the termination driver is configured to form a termination impedance, and comprises:

a termination pull-up driver configured to form a pull-up termination impedance value, based on the target impedance pull-up code; and a termination pull-down driver configured to form a pull-down termination impedance value, based on the target impedance pull-down code.

11. The impedance calibration circuit of claim 10, wherein the termination pull-up driver comprises a plurality of PMOS transistors having widths that are sequentially doubled, each of the plurality of PMOS transistors being driven by a bit value included in the target impedance pull-up code, and wherein the termination pull-down driver comprises a plurality of NMOS transistors having widths that are sequentially doubled, each of the plurality of NMOS transistors being driven by a bit value included in the target impedance pull-down code.

12. An impedance calibration circuit comprising:

a first code generation circuit configured to:

generate a first code by using a first reference resistor, and form a resistance based on the first reference resistor and the first code;

a second code generation circuit including a plurality of ZQ pull-up drivers configured to form a resistance of a second reference resistor, based on the first code, the second code generation circuit configured to generate a second code by using the second reference resistor; and a target impedance code generation circuit configured to:

select one from among the first code and the second code according to a result of comparing a target impedance value with a threshold impedance value, generate a target impedance code based on using the selected code, and form an impedance having the target impedance value for a termination driver connected to the impedance calibration circuit, wherein each ZQ pull-up driver includes either one or more PMOS transistors or one or more NMOS transistors.

13. The impedance calibration circuit of claim 12, wherein the target impedance code generation circuit is configured to:

when the target impedance value is greater than the threshold impedance value, select the first code, and when the target impedance value is less than the threshold impedance value, select the second code.

14. The impedance calibration circuit of claim 12, wherein the resistance of the second reference resistor corresponds to a value obtained by dividing the resistance of the first reference resistor by the number of ZQ pull-up drivers.

15. The impedance calibration circuit of claim 12, wherein the threshold impedance value is less than the resistance of the first reference resistor and greater than the resistance of the second reference resistor.

16. The impedance calibration circuit of claim 12, wherein the target impedance code generation circuit is configured to:

when the target impedance value is greater than the threshold impedance value, output the first code as the target impedance code in response to the target impedance value being the same as the resistance of the first reference resistor, and generate the target impedance code by shifting the first code by one bit in response to the target impedance value being different from the resistance of the first reference resistor, and when the target impedance value is less than the threshold impedance value, output the second code as the target impedance code in response to the target impedance value being the same as the resistance of the second reference resistor, and generate the target impedance code by shifting the second code by one bit in response to the target impedance value being different from the resistance of the second reference resistor.

17. The impedance calibration circuit of claim 12, wherein the first code generation circuit comprises:

at least one ZQ pull-up driver configured to form a first pull-up impedance, based on a first pull-up code included in the first code; and at least one ZQ pull-down driver configured to form a first pull-down impedance, based on a first pull-down code included in the first code, and wherein each of the plurality of ZQ pull-up drivers corresponds to the at least one ZQ pull-up driver.

18. An impedance calibration method performed by an impedance calibration circuit in a memory device comprising a memory cell region including a first metal pad, a peripheral circuit region including a second metal pad and vertically connected to the memory cell region by the first metal pad and the second metal pad, the impedance calibration circuit connected to a first reference resistor, the impedance calibration method comprising:

generating a first code for forming a resistance based on the first reference resistor, by using the first reference resistor;

generating a second code for forming a resistance of a second reference resistor formed based on the first code, by using the second reference resistor; and generating a target impedance code corresponding to a target impedance value, based on the first code, the second code, and the target impedance value.

19. The impedance calibration method of claim 18, wherein the generating of the target impedance code comprises:

comparing the target impedance value with a threshold impedance value; and generating the target impedance code by using a code selected from the first code and the second code according to a result of the comparing.

20. The impedance calibration method of claim 19, wherein the generating of the target impedance code by using the selected code comprises:

when the target impedance value is greater than the threshold impedance value, generating the target impedance code, based on either using the first code as the target impedance code or using a code obtained by shifting the first code by at least one bit; and when the target impedance value is less than the threshold impedance value, generating the target impedance code, based on either using the second code as the target impedance code or using a code obtained by shifting the second code by at least one bit.

* * * * *